United States Patent
Chen et al.

(10) Patent No.: US 9,349,948 B2
(45) Date of Patent: May 24, 2016

(54) NON-VOLATILE VARIABLE RESISTIVE ELEMENT, CONTROLLING DEVICE AND STORAGE DEVICE

(71) Applicant: KABUSHIKI KAISHA TOSHIBA, Minato-ku (JP)

(72) Inventors: Jiezhi Chen, Kanagawa (JP); Reika Ichihara, Kanagawa (JP); Yuuichiro Mitani, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 170 days.

(21) Appl. No.: 13/965,733

(22) Filed: Aug. 13, 2013

(65) Prior Publication Data

US 2014/0092669 A1 Apr. 3, 2014

(30) Foreign Application Priority Data

Oct. 3, 2012 (JP) .................................. 2012-221295

(51) Int. Cl.
| | |
|---|---|
| *G11C 13/00* | (2006.01) |
| *H01L 45/00* | (2006.01) |
| *H01L 27/24* | (2006.01) |
| *G11C 11/56* | (2006.01) |

(52) U.S. Cl.
CPC ............ *H01L 45/12* (2013.01); *G11C 11/5685* (2013.01); *G11C 13/0002* (2013.01); *G11C 13/004* (2013.01); *G11C 13/0007* (2013.01); *G11C 13/0069* (2013.01); *H01L 27/2463* (2013.01); *H01L 45/085* (2013.01); *H01L 45/1233* (2013.01); *H01L 45/1266* (2013.01); *H01L 45/148* (2013.01); *H01L 45/16* (2013.01); *G11C 2013/0073* (2013.01); *G11C 2213/77* (2013.01)

(58) Field of Classification Search
CPC ........... G11C 11/5685; G11C 13/0002; G11C 13/0007; G11C 13/004; G11C 13/0069; G11C 2013/0073; G11C 2213/77
See application file for complete search history.

(56) References Cited

U.S. PATENT DOCUMENTS

| | | | |
|---|---|---|---|
| 2006/0077706 A1* | 4/2006 | Li et al. ......................... | 365/163 |
| 2008/0080226 A1 | 4/2008 | Mikolajick et al. | |
| 2008/0298114 A1* | 12/2008 | Liu et al. ....................... | 365/148 |
| 2011/0305064 A1* | 12/2011 | Jo et al. ......................... | 365/148 |
| 2012/0211719 A1* | 8/2012 | Haimoto et al. ................. | 257/4 |

FOREIGN PATENT DOCUMENTS

| | | |
|---|---|---|
| JP | 2007-184613 | 7/2007 |
| JP | 2008-112554 | 5/2008 |

* cited by examiner

*Primary Examiner* — Khamdan Alrobaie
(74) *Attorney, Agent, or Firm* — Oblon, McClelland, Maier & Neustadt, L.L.P.

(57) ABSTRACT

A non-volatile variable resistive element according to an embodiment comprises a first electrode including a first metal, a second electrode including a second metal, a third electrode placed opposite to the first and second electrodes, and a variable resistive layer placed between the first and second electrodes and the third electrode, a resistance of the variable resistive layer reducing when at least either one of the first metal and the second metal is diffused into the variable resistive layer and the resistance of the variable resistive layer rising when at least either one of the first metal and the second metal diffused into the variable resistive layer is collected by the first electrode or the second electrode.

11 Claims, 41 Drawing Sheets

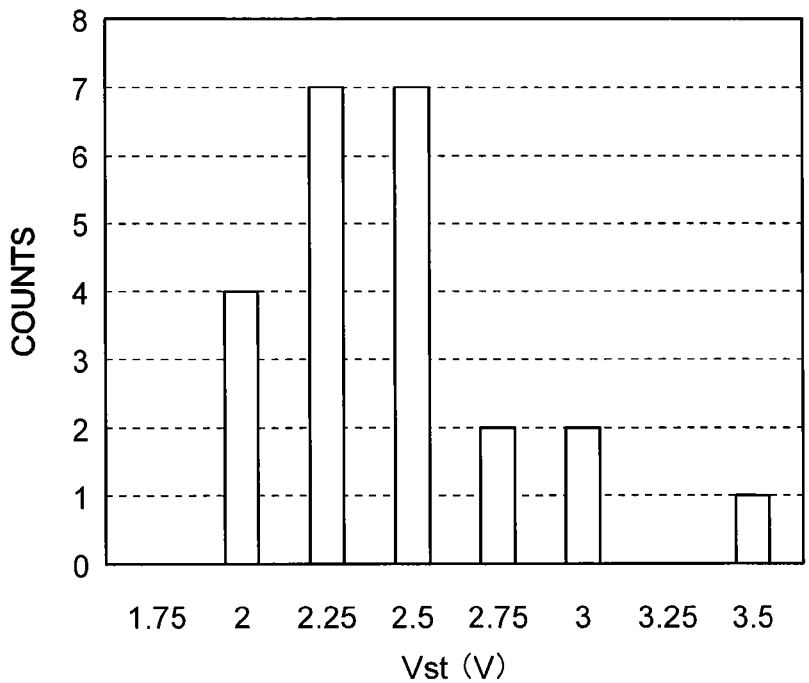
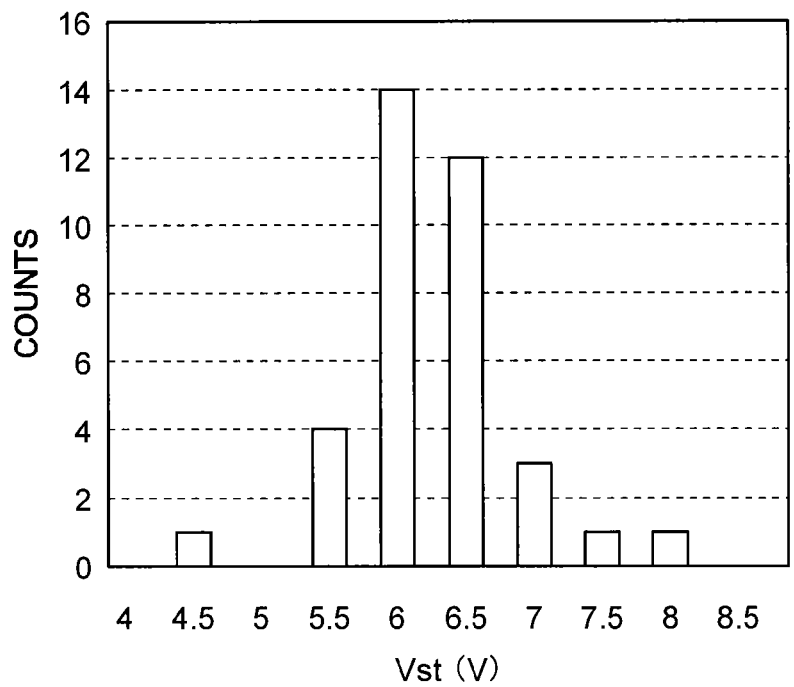

FIG.62
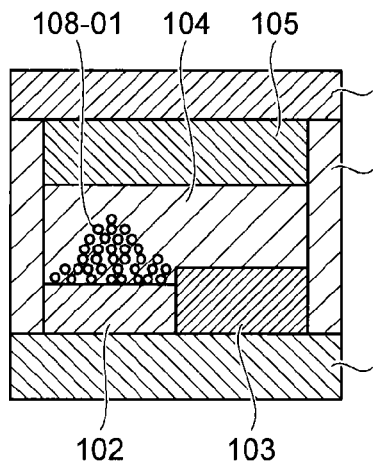 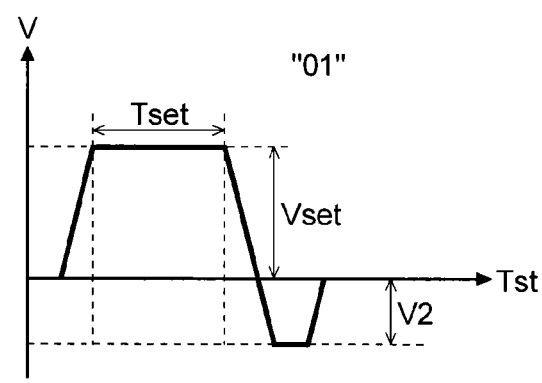
FIG.63
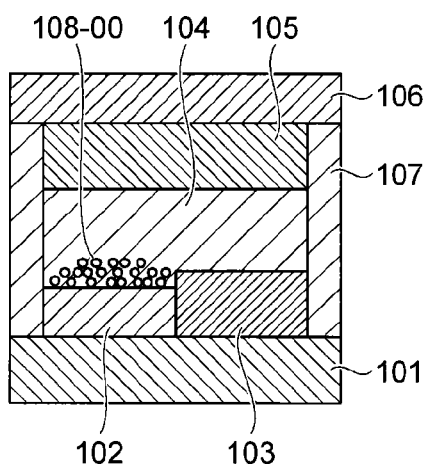 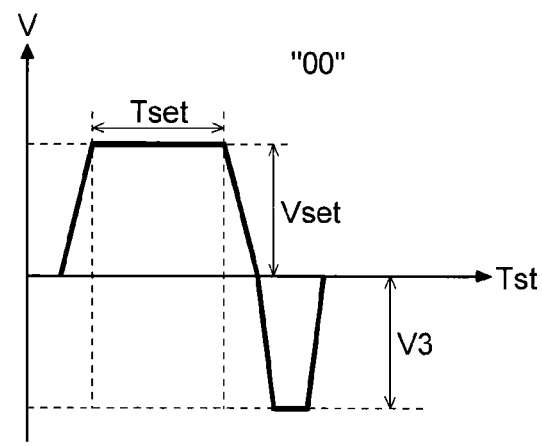

NON-VOLATILE VARIABLE RESISTIVE ELEMENT, CONTROLLING DEVICE AND STORAGE DEVICE

CROSS-REFERENCE TO RELATED APPLICATION(S)

This application is based upon and claims the benefit of priority from the Japanese Patent Application No. 2012-221295, filed on Oct. 3, 2012; the entire contents of which are incorporated herein by reference.

FIELD

Embodiments described herein relate generally to a non-volatile variable resistive element, a controlling device thereof and a storage device having the non-volatile variable resistive element.

BACKGROUND

In recent years, development on a two-terminal non-volatile variable resistive element as typified by ReRAM (resistive random access memory) is being made enthusiastically. Because low-power operation, high-speed switching and miniaturization can be achieved, the non-volatile variable resistive element potent as a next-generation mass storage device that can be an alternative to existing products such as a floating-gate-type NAND flash memory, and so forth.

BRIEF DESCRIPTION OF THE DRAWINGS

FIG. 20 is an illustration showing an evaluation result indicating the number of occurrences (number of counts) of stress effect at the minimum stress voltage (critical voltage) observed in the evaluation according to the first embodiment, in which the metal is Ag;

FIG. 21 is an illustration showing an evaluation result indicating the number of occurrences (number of counts) of stress effect at the minimum stress voltage (critical voltage) observed in the evaluation according to the first embodiment, in which the metal is Ni;

FIG. 62 is an illustration for explaining a case where a value '01' is written in the non-volatile variable resistive element based on the reversed reset bias voltage shown in FIG. 59;

FIG. 63 is an illustration for explaining a case where a value '00' is written in the non-volatile variable resistive element based on the reversed reset bias voltage shown in FIG. 59;

DETAILED DESCRIPTION

Exemplary embodiments of a non-volatile variable resistive element, a controlling device, a storage device having the non-volatile variable resistive element and a method of controlling the non-volatile variable resistive element will be explained below in detail with reference to the accompanying drawings.

First Embodiment

A non-volatile variable resistive element, a controlling device, a storage device and a method of controlling the non-volatile variable resistive element according to a first embodiment will be explained below in detail with reference to the accompanying drawings.

Figure 1:
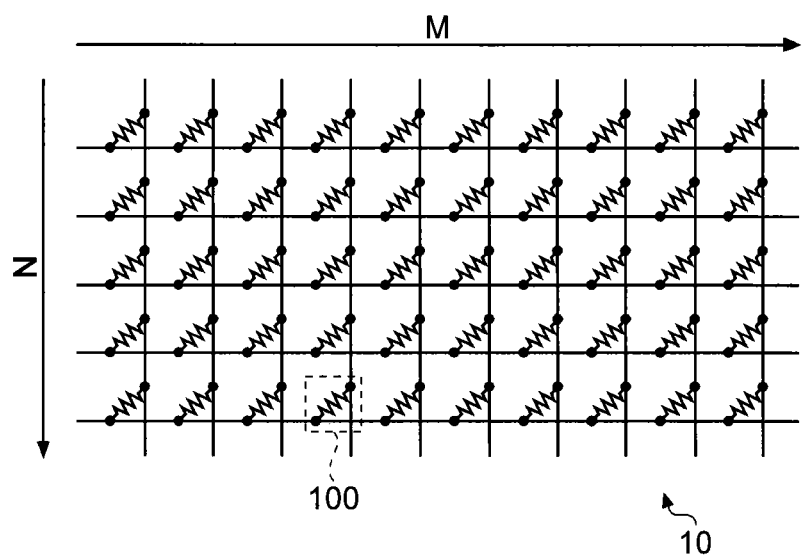
FIG. 1 is a schematic diagram showing an example of a memory cell array in a storage device according to a first embodiment.

FIG. 1 is a schematic diagram showing an example of a memory cell array in a storage device according to a first embodiment. As shown in FIG. 1, a memory cell array 10 according to the first embodiment has a structure in that a plurality of cells each of which includes a non-volatile variable resistive element 100 are arrayed in two-dimension into M-row-N-column.

Figure 2:
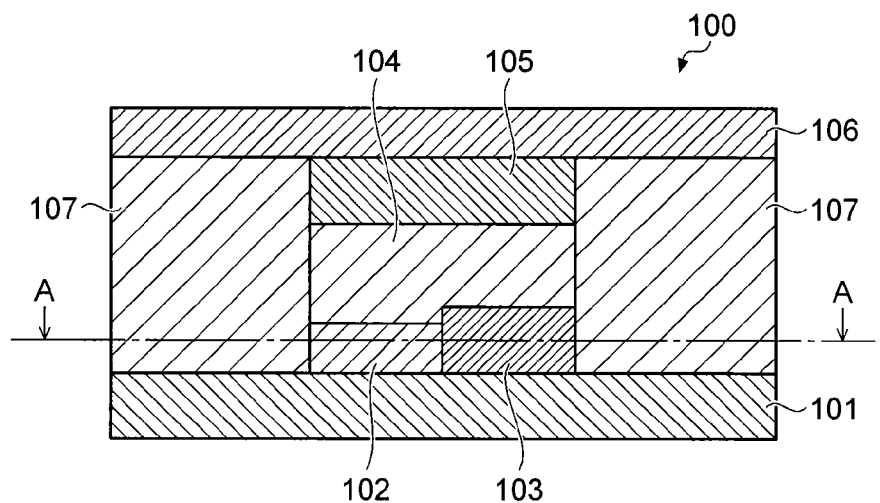
FIG. 2 is a vertical sectional view of a non-volatile variable resistive element according to the first embodiment when the non-volatile variable resistive element is cut in a direction of stack.
Figure 3:
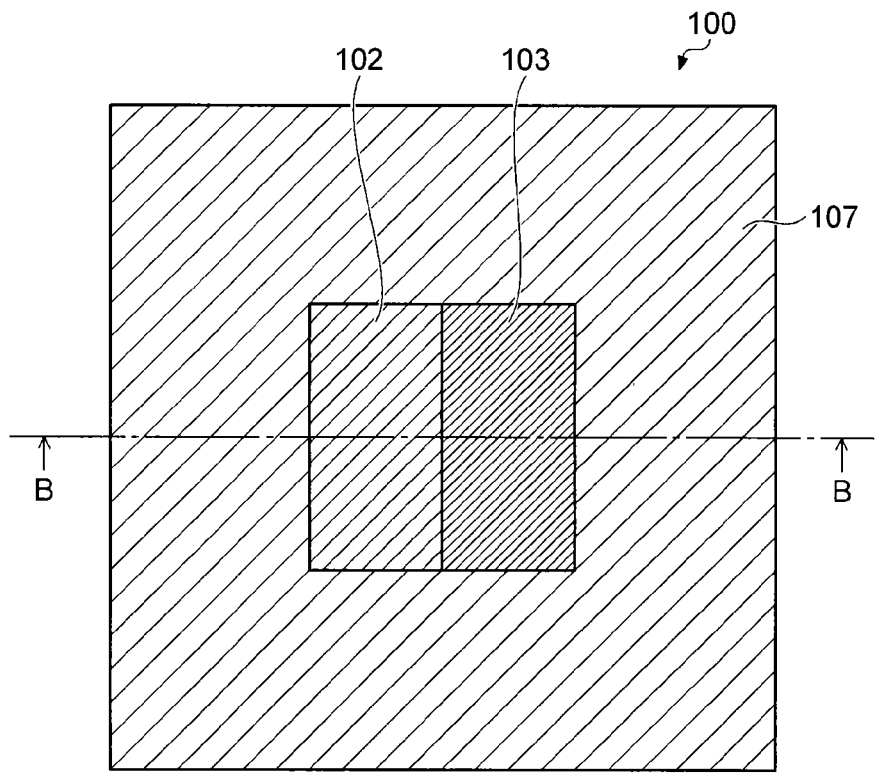
FIG. 3 is a horizontal sectional view of the non-volatile variable resistive element according to the first embodiment.

FIGS. 2 and 3 show an example of an outline structure of the non-volatile variable resistive element 100 according to the first embodiment. FIG. 2 is a vertical sectional view of the non-volatile variable resistive element when the non-volatile variable resistive element is cut in a direction of stack, and FIG. 3 is a horizontal sectional view of the non-volatile variable resistive element. Here, FIG. 2 shows a B-B cross-section structure in FIG. 3, and FIG. 3 shows an A-A cross-section structure in FIG. 2.

As shown FIGS. 2 and 3, the non-volatile variable resistive element 100 has a lower wiring (first wiring) 101, a first electrode 102, a second electrode 103, a variable resistive layer 104, a third electrode 105 and an upper wiring (second wiring) 106. Furthermore, adjacent non-volatile variable resistive elements 100 are electrically separated from each other by an insulator 107 dividing the elements. The non-volatile variable resistive elements 100 and the insulators 107 may be formed on a support substrate (not shown).

The first electrode 102 and the second electrode 103 are formed on the lower wiring 101 in side-by-side. Thicknesses of the first electrode 102 and the second electrode 103 may be different, or the same. The first electrode 102 and the second electrode 103 include metal elements such as silver (Ag), gold (Au), titanium (Ti), nickel (Ni), cobalt (Co), aluminium (Al), iron (Fe), chromium (Cr), copper (Cu), tungsten (W), hafnium (Hf), tantalum (Ta), platinum (Pt), ruthenium (Ru), zirconium (Zr), iridium (Ir), or the like. Furthermore, as a material of the first electrode 102 and the second electrode 103, in addition to the above-mentioned metals, nitrides thereof, carbides thereof, chalcogenide thereof, or the like, can be used. Moreover, the material of the first electrode 102 and the second electrode 103 may be an alloy including one or more of the above-mentioned metals. In a case of using an alloy as the material, in addition to the above-mentioned metals, it is possible to use a semiconductor material such as carbon (C), silicon (S), germanium (Ge), or the like.

The third electrode 105 is appropriate as long as it is a conductive film. As a material of the third electrode 105, in addition to the above-described metal, a doped semiconductor, or the like, can be used. For instance, a doped Si film can be made by activating a Si layer doped with boron (B), arsenic (As), phosphorus (P), or the like, by a heat treatment. The conductive semiconductor layer may be an amorphous semiconductor, a polycrystalline semiconductor, or a single crystal semiconductor.

The variable resistive layer 104 is made of an insulator. The variable resistive layer 104 can include a semiconductor element. For instance, Si, Ge, SiGe, GaAs, InP, GaP, GaInAs, P, GaN, SiC, or the like, can be applied to the semiconductor element. The variable resistive layer 104 may an amorphous semiconductor, a polycrystalline semiconductor, or a single crystal semiconductor. The variable resistive layer 104 may be doped with nitrogen atom (N) or oxygen atom (O).

The lower wiring 101 is electrically connected with the first and second electrodes 102 and 103. On the other hand, the upper wiring 106 is electrically connected with the third electrode. These lower wiring 101 and upper wiring 106 may be conductive films such as metal films, doped semiconductor films, or the like. The insulator 107 is, for instance, an insulating film such as a silicon oxide film, a silicon nitride film, or the like.

In such structure, by making the metal element of the first electrode 102 and the metal electrode of the second electrode 103 selectively coming in and out of the variable resistive layer 104, it is possible to reversibly change a resistance of the variable resistive layer 104. That is, when a voltage is impressed between the first and second electrodes 102 and 103 and the third electrode 105 in one direction (hereinafter defined as a forward direction) under a predetermined condition, one of the constituent metal elements of the first and second electrodes 102 and 103 diffuses into the variable resistive layer 104 toward the third electrode 105. Thereby, a conductive filament constructed from the metal element diffused into the variable resistive layer 104 is formed, and the variable resistive layer 104 changes from a high-resistance state (hereinafter referred to as off-state) to a low-resistance state (hereinafter referred to as on-state). When a voltage is impressed between the first and second electrodes 102 and 103 and the third electrode 105 in an inverse direction under a predetermined condition, the metal elements diffused into the variable resistive layer 104 are collected by the first electrode 102 or the second electrode 103 being a source thereof, and the conductive filament in the variable resistive layer 104 will disappear. As a result, the variable resistive layer 104 changes from the on-state to the off-state.

Choosing which metal element between the first electrode 102 and the second electrode 103 is to diffuse into the variable resistive layer 104 can be controlled by adjusting a voltage value and an impressing time of voltage applied to between the first and second electrodes 102 and 103 and the third electrode 105 while adjusting the thicknesses of the variable resistive layer 104 between the first electrode 102 and the third electrode 105 and between the second electrode 103 and the third electrode 105.

For example, by letting the stress wave shape of a voltage pulse applied to the first electrode 102 and the second electrode 103, i.e, the lower wiring 101, set to a low stress voltage and a long stress time, it is possible to form the conductive filament by diffusing the constituent metal elements of the first electrode 102. In this case, it is possible to suppress the diffusion of the constituent metal elements of the second electrode 103 to a negligible degree. On the other hand, by letting the stress wave shape of the voltage pulse applied to the lower wiring 101 set to a high stress voltage and a short stress time, it is possible to form the conductive filament by diffusing the constituent metal elements of the second electrode 103. In this case, it is possible to suppress the diffusion of the constituent metal elements of the first electrode 102 to a negligible degree.

A pulse wave shape of a control voltage applied to the lower wiring 101 is set after considering the characteristics of the first electrode 102 and the second electrode 103. In this case, a combination of metal materials used for the first electrode 102 and the second electrode 103 will be considered. For instance, in a case where Ag is used for the first electrode 102 and Ni is used for the second electrode 103, a voltage value of the stress voltage to satisfy a condition for forming an Ag filament without forming an Ni filament becomes equal to or less than 4 V (volt).

Figure 4:
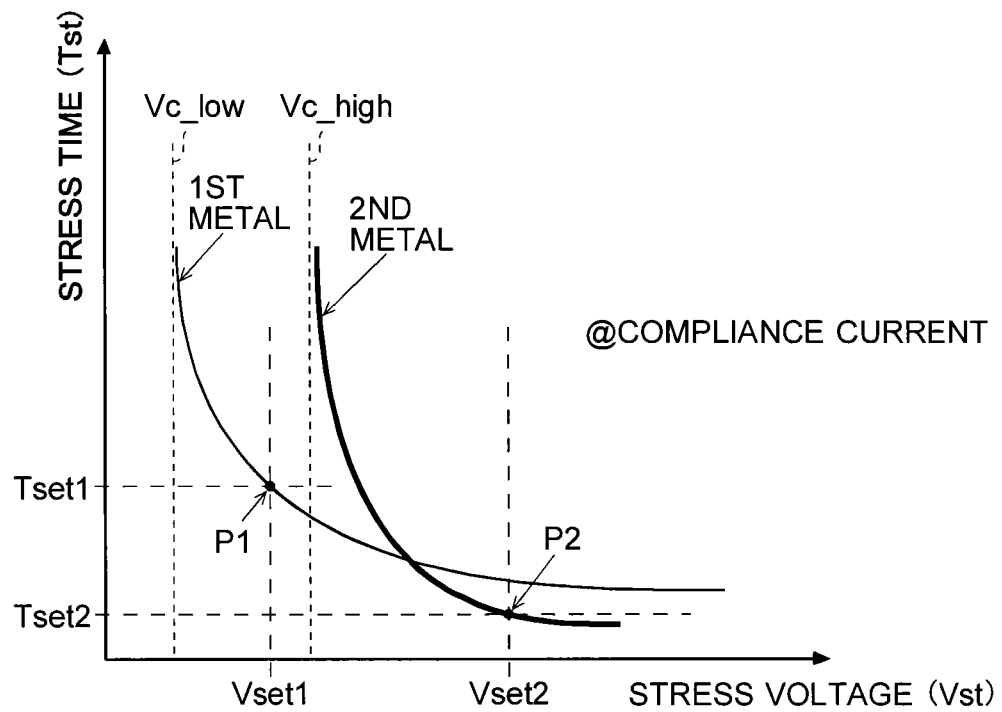
FIG. 4 is a correlation chart showing a relationship between a stress voltage and a stress time at a time when voltage pulses are impressed to two different metals in the first embodiment.

FIG. 4 is a correlation chart showing a relationship between a stress voltage and a stress time at a time when voltage pulses are impressed to different metals. In addition, FIG. 4 shows a correlation relationship between the stress voltage and the stress time until a current flowing through each metal becomes a constant compliance current.

In an example shown in FIG. 4, a critical voltage value Vc_low of a first metal (a minimum value of the stress voltage for forming a filament) is smaller than a critical voltage value Vc_high of a second metal. Furthermore, when the stress voltage is comparatively low, a stress time for forming a conductive filament by the first metal is shorter than that by the second metal, and when the stress voltage is comparatively high, the stress time for forming the conductive filament by the second metal is shorter than that by the first metal. Therefore, by applying a combination of metals with such correlation relationship to the first electrode 102 and the second electrode 103, it is possible to selectively manufacture a non-volatile variable resistive element having different characteristics. In the following, an example in which the first metal is used for the first electrode 102 and the second metal is used for the second electrode 103 will be described.

In FIG. 4, for data writing using the first electrode 102 made of the first metal, a condition (mode P1) where stress voltage is comparatively low and stress time is comparatively long is used, and for data writing using the second electrode 103 made of the second metal, a condition (mode P2) where the stress voltage is comparatively high and the stress time is comparatively short is used. As is clear from a comparison between the modes P1 and P2, the stress voltage Vset1 under the mode P1 is lower than the critical voltage value Vc_high of the second metal. Therefore, under the mode P1, formation of the conductive filament by the second metal does not substantively appear, and formation of the conductive filament by the first metal becomes dominant. On the other hand, under a stress voltage Vset2 of the mode P2, the stress time of the second metal is shorter than the stress time of the first metal. Therefore, under the mode P2, formation of the conductive filament by the second metal becomes dominant. Here, the stress time of the mode P2 should be set as a period of time to a degree that the conductive filament extending from the first metal will not reach the third electrode 105.

Figure 5:
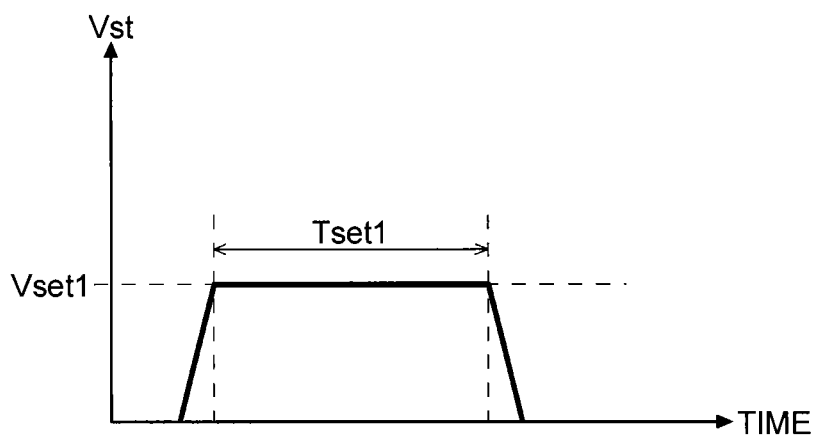
FIG. 5 is a timing chart showing an example of a voltage pulse to be impressed at a time of writing using a first electrode.
Figure 6:
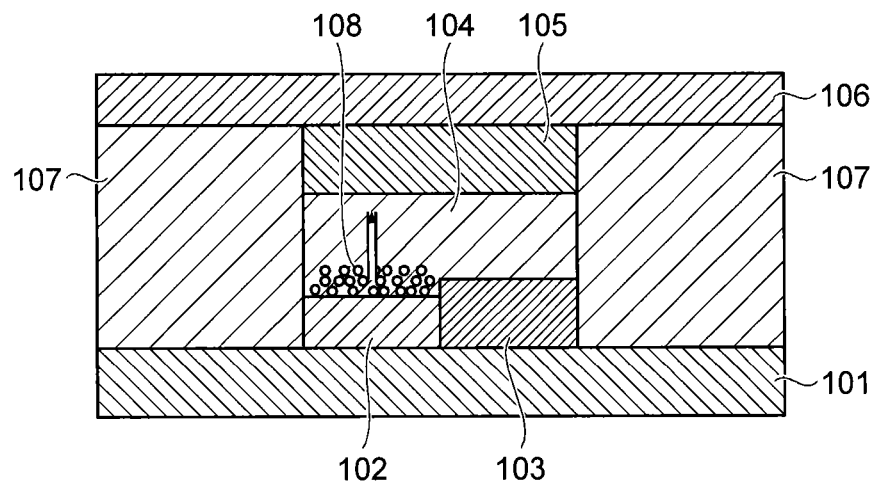
FIG. 6 is a cross-section view showing a non-volatile variable resistive element at an off-state before the voltage pulse shown in FIG. 5 is impressed.
Figure 7:
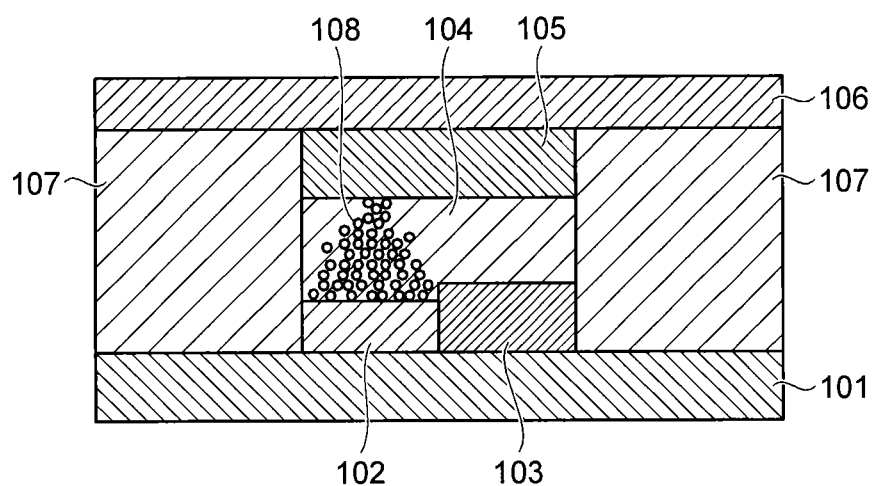
FIG. 7 is a cross-section view showing a non-volatile variable resistive element at an on-state after impressing the voltage pulse shown in FIG. 5 is impressed.

In FIGS. 5 to 7, a writing operation under the mode P1 in FIG. 4 is shown. FIG. 5 is a timing chart showing an example of a voltage pulse to be impressed at a time of writing using a first electrode. FIG. 6 is a cross-section view showing a non-volatile variable resistive element at an off-state before the voltage pulse shown in FIG. 5 is impressed. FIG. 7 is a cross-section view showing a non-volatile variable resistive element at an on-state after the voltage pulse shown in FIG. 5 is impressed.

As shown in FIG. 5, under the mode P1, a rectangular voltage pulse of which stress voltage is Vset1 (<Vc_high) and stress time is Tset1 (>Tset2) is applied to the lower wiring 101. Then, as shown in FIG. 6, in the non-volatile variable resistive element 100, a conductive filament 108 is formed in the variable resistive layer 104 from the first electrode 102 toward the third electrode 105. As a result, as shown in FIG. 7, the first electrode 102 and the third electrode 105 are made electrically connected by the conductive filament 108 reaching the third electrode 105, whereby, the non-volatile variable resistive element 100 turns into the on-state.

Figure 8:
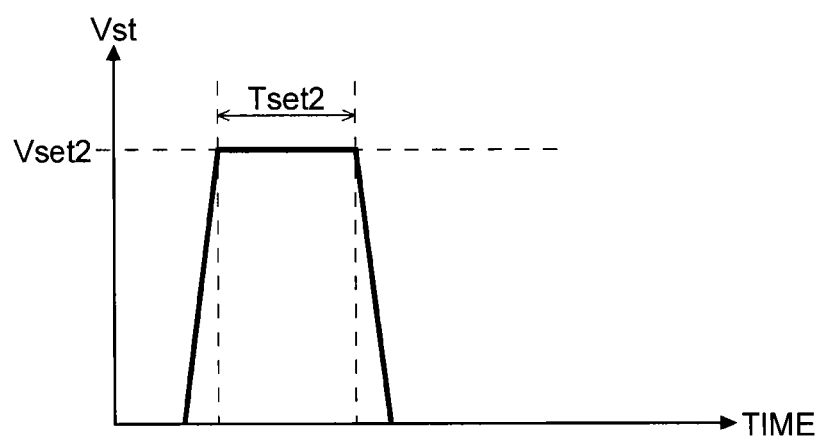
FIG. 8 is a timing chart showing an example of a voltage pulse to be impressed at a time of writing using a second electrode.
Figure 9:
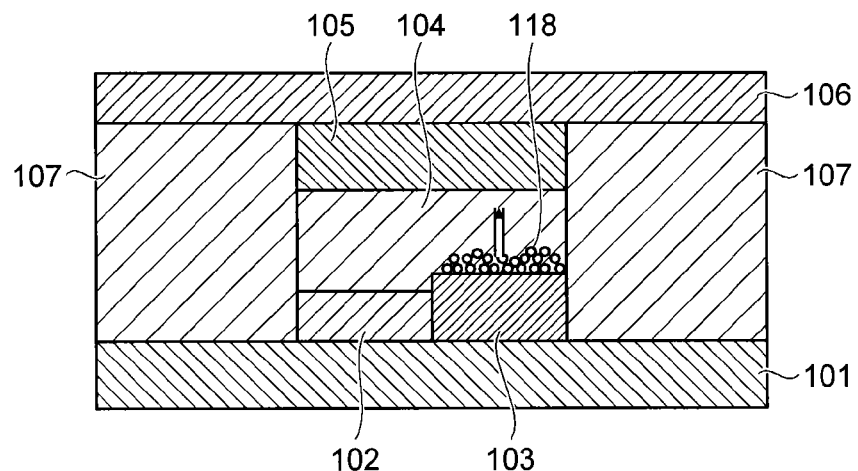
FIG. 9 is a cross-section view showing a non-volatile variable resistive element at an off-state before the voltage pulse shown in FIG. 8 is impressed.
Figure 10:
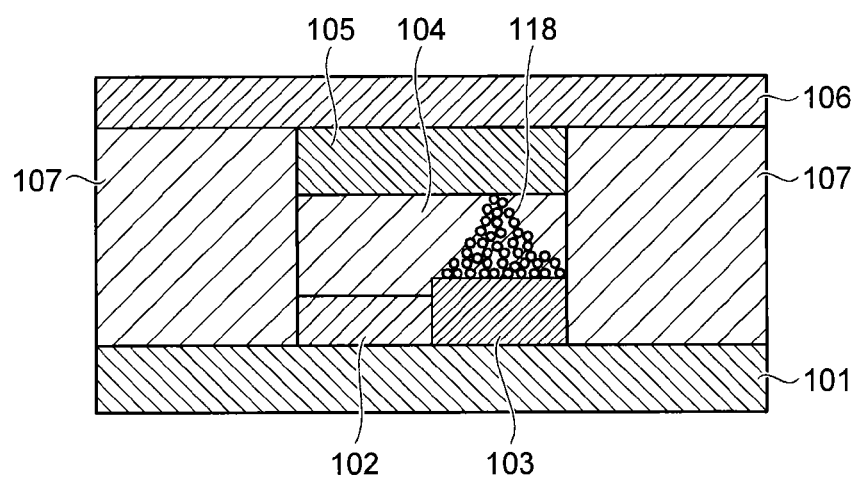
FIG. 10 is a cross-section view showing a non-volatile variable resistive element at an on-state after the voltage pulse shown in FIG. 8 is impressed.

In FIGS. 8 to 10, a writing operation under the mode P2 is shown. FIG. 8 is a timing chart showing an example of a voltage pulse to be impressed at a time of writing using a second electrode. FIG. 9 is a cross-section view showing a non-volatile variable resistive element at an off-state before the voltage pulse shown in FIG. 8 is impressed. FIG. 10 is a cross-section view showing a non-volatile variable resistive element at an on-state after the voltage pulse shown in FIG. 8 is impressed.

As shown in FIG. 8, in the mode P2, under the mode P2, a rectangular voltage pulse of which stress voltage is Vset2 (>Vc_high) and stress time is Tset2 (<Tset1) is applied to the lower wiring 101. Then, as shown in FIG. 9, in the non-volatile variable resistive element 100, a conductive filament 118 is formed in the variable resistive layer 104 from the first electrode 102 toward the third electrode 105. As a result, as shown in FIG. 10, the second electrode 103 and the third electrode 105 are made electrically connected by the conductive filament 118 reaching the third electrode 105, whereby, the non-volatile variable resistive element 100 turns into the on-state. At this time, although the conductive filament 108 is also formed from the first electrode 102 toward the third electrode 105, because the stress time Tset2 in the mode P2 is set as a period of time to a degree that the conductive filament 108 will not reach the third electrode 105, such conductive filament 108 can be neglected.

Reset of the non-volatile variable resistive element 100 from on-state to off-state is conducted by applying a voltage of which direction is opposite to that at the time of writing. For example, when the on-state shown in FIG. 7 is to be reset, a negative voltage with respect to the third electrode 105 is to be applied to the lower wiring 101. Then, by holes being supplied to the variable resistive layer 104 via the third electrode 105, the metal elements of the conductive filament 108 are ionized in the variable resistive layer 104. Thereby, those metal ions are collected by the first electrode 102, and the conductive filament 108 in the variable resistive layer 104 will disappear. As a result, the variable resistive layer 104 becomes a high-resistive state, whereby, the non-volatile variable resistive element 100 will be reset to the off-state.

Likewise, when the on-state shown in FIG. 8 is to be reset, by a negative voltage with respect to the third electrode 105 is to be applied to the lower wiring 101, the metal element of the conductive filament 118 in the variable resistive layer 104 is ionized. Thereby, those metal ions are collected by the second electrode 103, and the conductive filament 118 in the variable resistive layer 104 will disappear. As a result, the variable resistive layer 104 becomes a high-resistive state, whereby, the non-volatile variable resistive element 100 will be reset to the off-state.

In addition, when the voltage pulse shown in FIG. 5 or 8 is applied again to the non-volatile variable resistive element 100 having been reset, the conductive filament 108 or 118 will be formed again in the variable resistive layer 104 as shown in FIG. 7 or 10, and the non-volatile variable resistive element 100 will turn into the on-state. In this way, it is possible to reversibly control the on-state and the off-state of the non-volatile variable resistive element 100.

Next, an operation of the non-volatile variable resistive element 100 will be described in detail with accompanying drawings.

As described above, from which between the first electrode 102 and the second electrode 103 the metal element is to diffuse into the variable resistive layer 104 is basically decided on the basis of the voltage-stress characteristics of the conductive filaments 108 and 118. Therefore, by using a difference of the characteristics of the conductive filaments 108 and 118, it is possible to extend longevity of the non-volatile variable resistive element 100.

Figure 11:
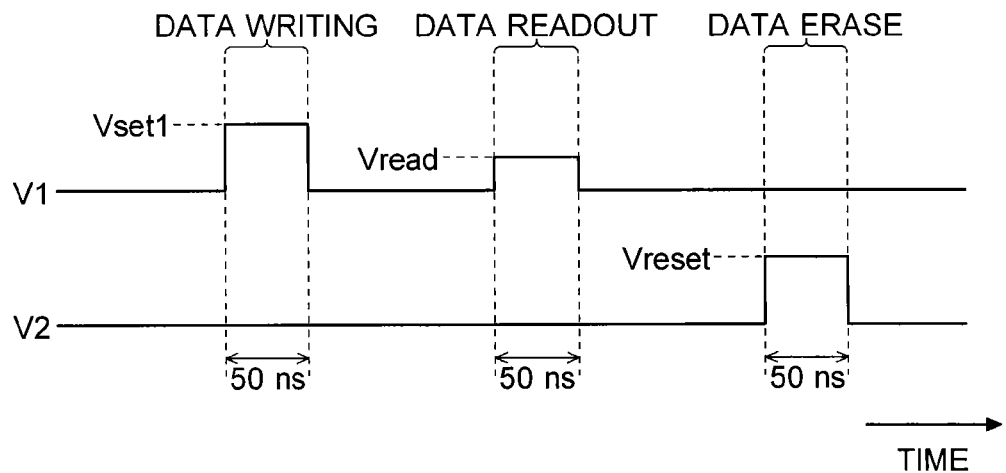
FIG. 11 is a timing chart showing an example of a method of impressing a pulse voltage at a time of data writing, data readout and data erase when the first electrode according to the first embodiment is being used.
Figure 12:
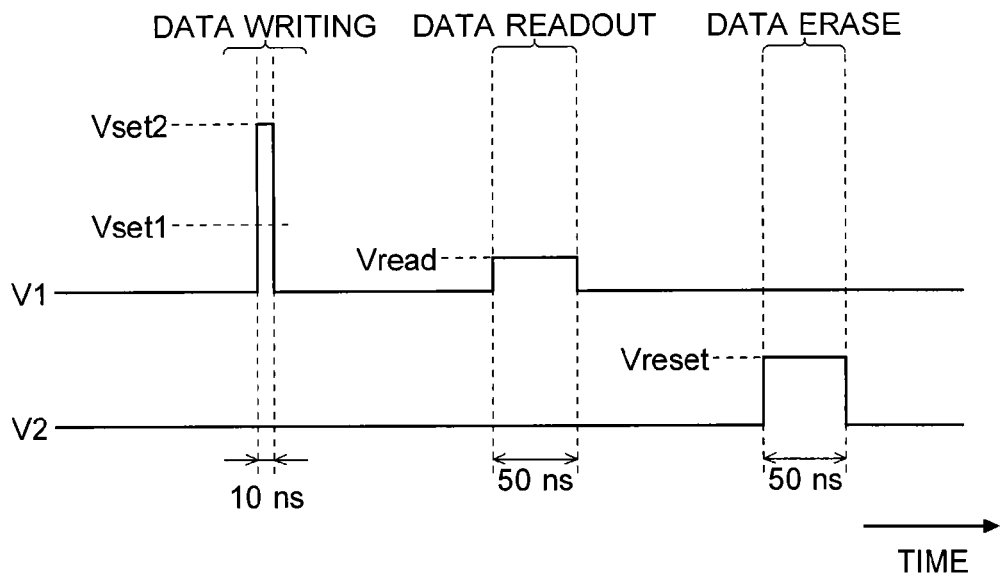
FIG. 12 is a timing chart showing an example of a method of impressing a pulse voltage at a time of data writing, data readout and data erase when the second electrode according to the first embodiment is being used.

FIG. 11 is a timing chart showing an example of a method of impressing a pulse voltage at a time of data writing, data readout and data erase when the first electrode is being used. FIG. 12 is a timing chart showing an example of a method of impressing a pulse voltage at a time of data writing, data readout and data erase when the second electrode is being used.

As shown in FIG. 11, at a time of data writing using the first electrode 102, a voltage pulse of the mode P1 of which stress voltage is comparatively low and stress time is comparatively long is impressed to the lower wiring 101. Thereby, the first metal diffused into the variable resistive layer 104 from the first electrode 102 is ionized, and the conductive filament 108 made of the first metal will be formed in the variable resistive layer 104.

On the other hand, as shown in FIG. 12, at a time of data writing using the second electrode 103, a voltage pulse of mode P2 of which stress voltage is comparatively high and stress time is comparatively short is impressed to the lower wiring 101. Thereby, the second metal diffused into the variable resistive layer 104 from the second electrode 103 is ionized, and the conductive filament 118 made of the second metal will be formed in the variable resistive layer 104.

In this way, by adjusting the stress voltage and the stress time of the voltage pulse to be impressed to the lower electrode 101, it is possible to selectively use data writing using the first electrode 102 and data writing using the second electrode 103.

For example, in a case where an upper limit is set to the number of data writings with respect to each electrode, it is possible to operate such that when the number of data writings using one electrode reaches the upper limit, data writing is then conducted by the other electrode. Thereby, it is possible to extend longevity of the non-volatile variable resistive element 100.

For instance, by having a structure in that the non-volatile variable resistive element 100 is driven by the stress voltage and the stress time of the mode P1 shown in FIG. 11 until the number of data writings reaches a constant number, and after the number of the data writings has reached the constant number, driven by the stress voltage and the stress time of the mode P2 shown in FIG. 12, it is possible to extend longevity of the non-volatile variable resistive element 100.

Moreover, when a speed of data writing/data readout/data erase using the second electrode 103 is faster than a speed of data writing/data readout/data erase using the first electrode 102, for instance, it is possible to operate such that data writing of data to which access frequency is high is conducted preferentially using the second electrode 103. Furthermore, when a data-holding characteristic of the conductive filament 108 made of the first metal is better than a data-holding characteristic of the conductive filament 118 made of the second metal, for instance, it is possible to operate such that data writing of data which may be a target for long storage is conducted preferentially using the first electrode 102. Moreover, it is also possible to design such that the operation mode is switched in response to a requirement from an application, for example in order to let the non-volatile variable resistive element 100 drive by the mode P2 with the high stress voltage and the short stress time as shown in FIG. 12 when the access speed is to be emphasized, or let the non-volatile variable resistive element 100 drive by the mode P1 with the low stress voltage and the long stress time as shown in FIG. 11 when permanency (number of cycles) is to be emphasized.

In addition, voltage values and pulse widths of a readout pulse Vread for data readout and a reset pulse Vreset for data reset should be adjusted based on which of the electrodes is used for data writing, respectively.

Furthermore, in order to ensure data writing using the second electrode 103 under the mode P2, the thickness of the variable resistive layer 104 between the second electrode 103 and the third electrode 105 may be made thinner than the thickness of the variable resistive layer 104 between the first electrode 102 and the third electrode 105. However, such thinning arrangement is not essential.

Figure 13:
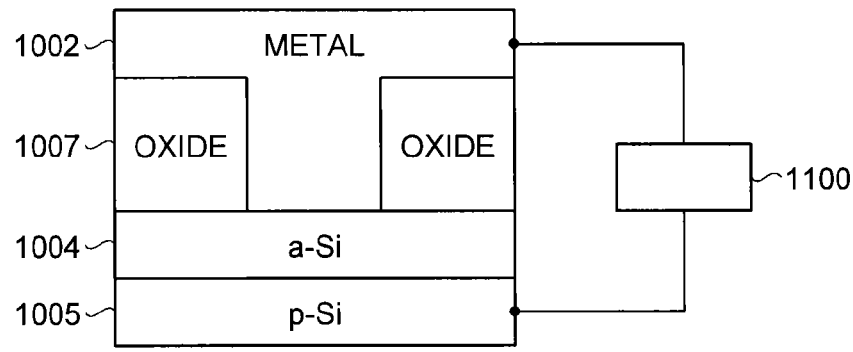
FIG. 13 is a schematic diagram showing an evaluator of the non-volatile variable resistive element according to the first embodiment.
Figure 14:
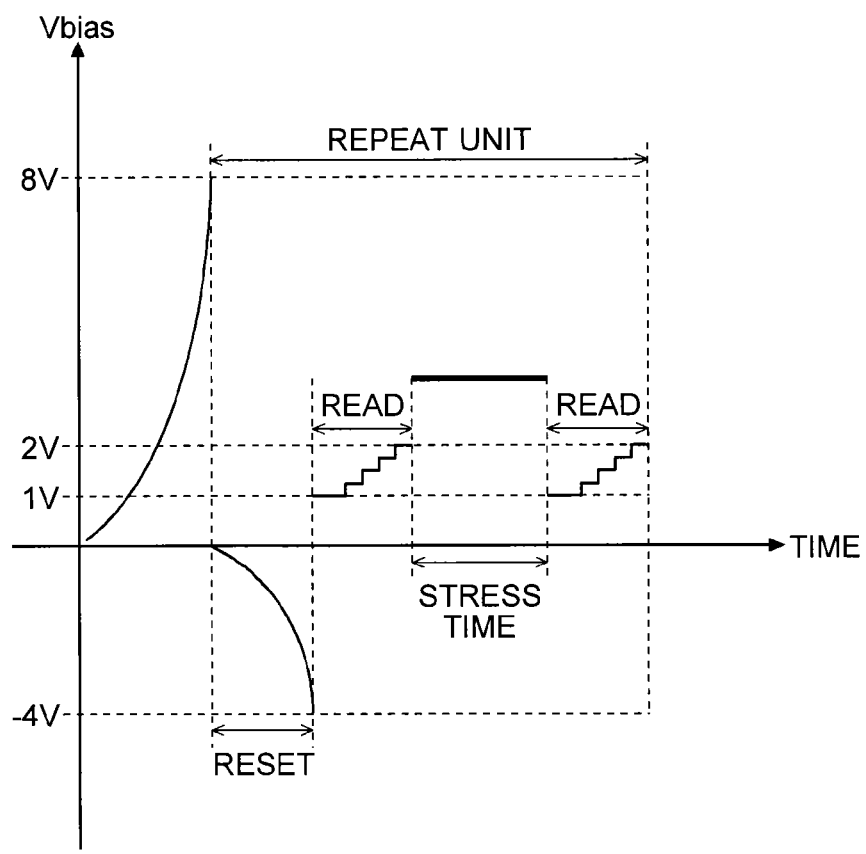
FIG. 14 is a timing chart showing a measurement sequence at a time of actual measurement conducted using the evaluator shown in FIG. 13.

Next, a method of evaluating the non-volatile variable resistive element will be described in detail. FIG. 13 is a schematic diagram showing an evaluator of the non-volatile variable resistive element. FIG. 14 is a timing chart showing a measurement sequence at a time of actual measurement conducted using the evaluator shown in FIG. 13.

As shown in FIG. 13, in a non-volatile variable resistive element being a target for evaluation, Ag or Ni is used as a metal material of an upper electrode 1002 corresponding to the first electrode 102 or the second electrode 103, and a diameter of the upper electrode 1002 (i.e. a diameter of a via hole for the upper electrode 1002 formed at an insulator 1007) is set to 100 nm (nanometer). Furthermore, amorphous silicon is used for a variable resistive layer 1004 corresponding to the variable resistive layer 104, and a thickness of the variable resistive layer 1004 is set to within 10 to 30 nm. Moreover, a low-resistance doped silicon is used for a lower electrode 1005 corresponding to the third electrode 105. With respect to such non-volatile variable resistive element, a current flowing on the variable resistive layer 1004 is measured with a measurement sequence as shown in FIG. 14 using a current-voltage characteristic measuring device connected between the upper electrode 1002 and the lower electrode 1005.

As shown in FIG. 14, in the measurement sequence, in order to verify a stress effect due to impression of a voltage pulse, as a first method, readout currents before and after impression of a voltage stress are measured and compared. Furthermore, as a second method, a current on the way to impressing the voltage stress is monitored in order to determine whether there is any dynamic variation in the current. Moreover, in the example shown in FIG. 14, when an Ag electrode is used as the upper electrode 1002, an upper limit of voltage for data writing (set voltage) is set to 8 V (volt), a voltage for data readout (readout voltage) is set to within 1 to 2 V, and a voltage for data erase (reset voltage) is set to –4 V. Moreover, in FIG. 14, processes starting from an impression of the reset voltage to a second impression of the readout voltage are defined as a repeat unit, and executed repeatedly.

Figure 15:
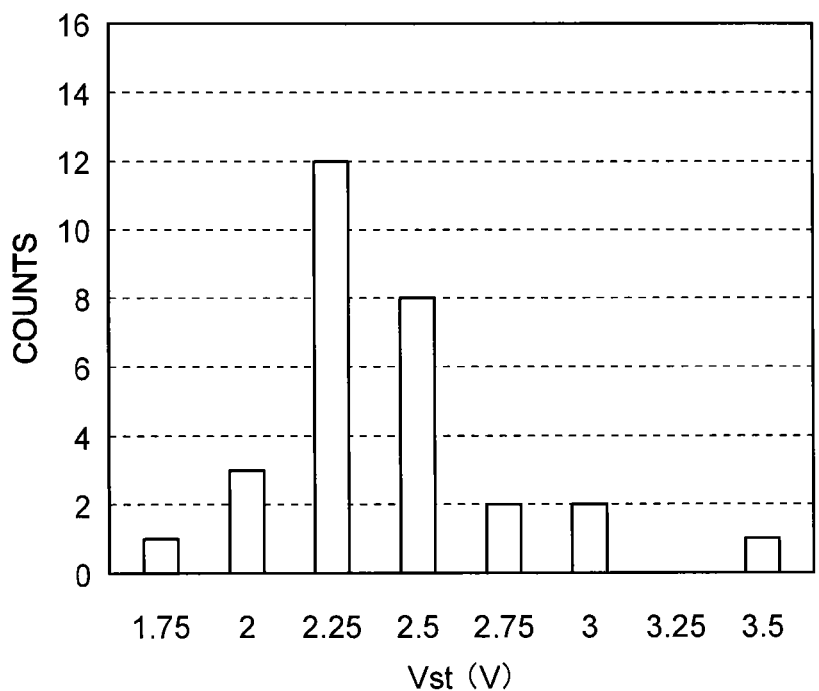
FIG. 15 is an illustration showing an evaluation result indicating the number of occurrences (number of counts) of stress effect at a minimum stress voltage (critical voltage) observed in evaluation according to the first embodiment, in which the thickness of the variable resistive layer is 10 nm.
Figure 16:
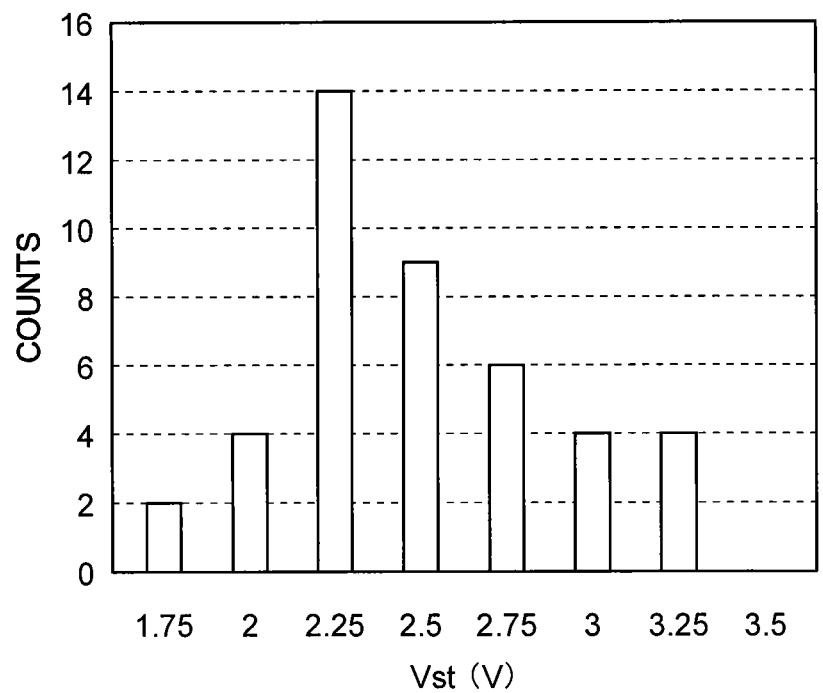
FIG. 16 is an illustration showing an evaluation result indicating the number of occurrences (number of counts) of stress effect at the minimum stress voltage (critical voltage) observed in the evaluation according to the first embodiment, in which the thickness of the variable resistive layer is 30 nm.

FIGS. 15 and 16 are illustrations showing evaluation results each indicating the number of occurrences (number of counts) of stress effect at a minimum stress voltage (critical voltage) observed by changing a stress voltage during a certain period under a case where a thickness of the variable resistive layer 1004 is varied while the same metal is used for the upper electrode 1002 in the evaluations shown in FIGS. 13 and 14. Here, in the following explanations of evaluation results, the evaluations in FIGS. 13 and 14 are conducted on a plurality of non-volatile variable resistive elements (see FIG. 13). Moreover, in FIG. 15, a thickness of the variable resistive layer 1004 is set to 10 nm, and in FIG. 16, a thickness of the variable resistive layer 1004 is set to 30 nm.

As is clear from the evaluation results indicated as statistics distributions shown in FIGS. 15 and 16, the number of occurrences of stress effects at the minimum stress voltage does not depend on the thickness of the variable resistive layer 1004. A distribution of the minimum stress voltage extracted from each non-volatile variable resistive element maintains a constant shape against variations of the stress voltage, and not any holistic shift was even observed.

Figure 17:
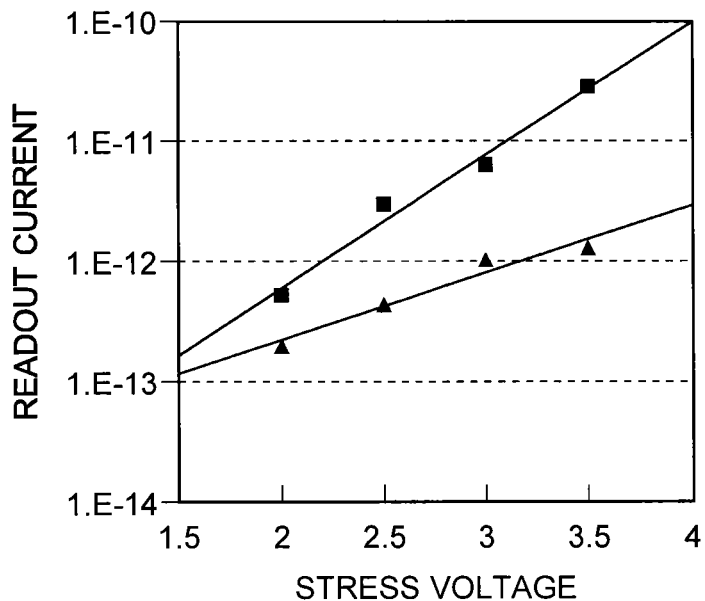
FIG. 17 is an illustration showing an evaluation result indicating a relationship between a stress voltage and a readout current under a constant stress time in the evaluation according to the first embodiment.
Figure 18:
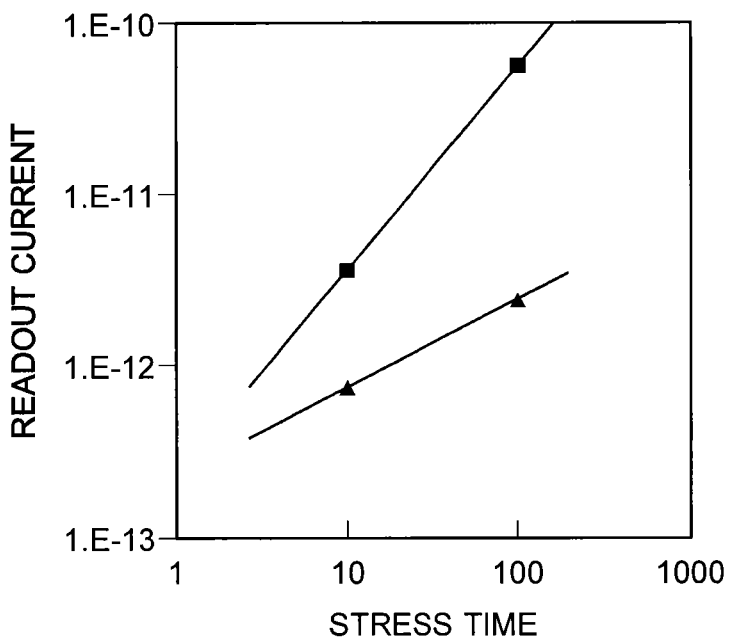
FIG. 18 is an illustration showing an evaluation result indicating a relationship between a stress time and a readout current under a constant stress voltage in the evaluation according to the first embodiment.

FIG. 17 shows an evaluation result indicating a relationship between a stress voltage and a readout current under a constant stress time in the evaluations shown in FIGS. 13 and 14. FIG. 18 shows an evaluation result indicating a relationship between a stress time and a readout current under a constant stress voltage in the evaluations shown in FIGS. 13 and 14. In FIGS. 17 and 18, black square points show a case where an amorphous silicon of which thickness is 10 nm is used as the variable resistive layer 1004, and black trigonal points show a case where an amorphous silicon of which thickness is 30 nm is used as the variable resistive layer 1004. Moreover, in both FIGS. 17 and 18, silver (Ag) is used for the upper electrode 1002. Furthermore, in FIG. 17, the stress time is set to 100 s (seconds), and in FIG. 18, the stress voltage is set to 3.5 V (volt).

As shown in FIG. 17, under a constant stress time, with respect to the same stress voltages, a thinner variable resistive layer 1004 may provide a larger variation of the readout current. In addition, the thinner variable resistive layer 1004 may exhibit a lower stress voltage until the readout current is saturated.

Likewise, as shown in FIG. 18, under a constant stress voltage, with respect to the same stress times, the thinner variable resistive layer 1004 may provide a large variation of the readout current. In addition, the thinner variable resistive layer 1004 may exhibit a shorter stress time until the readout current is saturated.

Figure 19:
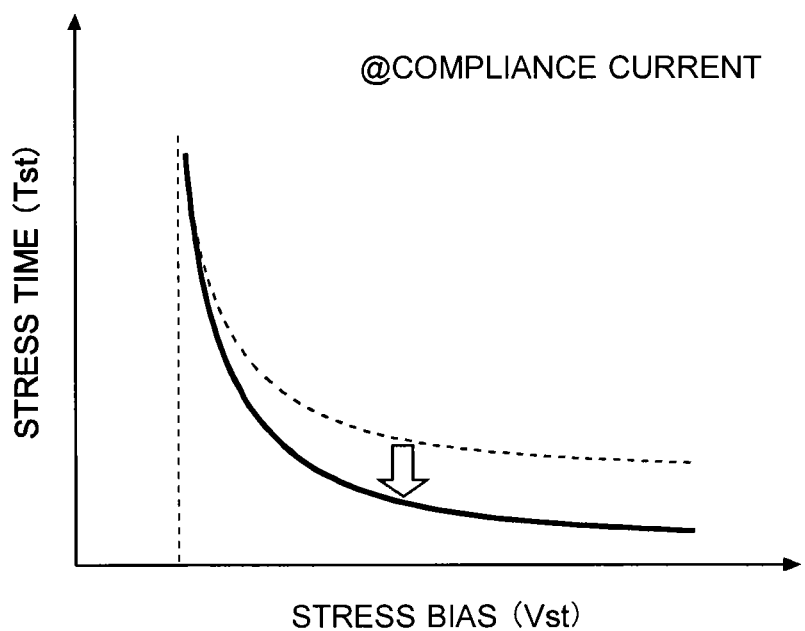
FIG. 19 is a diagram showing a summary of the evaluation results of FIGS. 17 and 18.

FIG. 19 shows a summary of the evaluation results of FIGS. 17 and 18, and is a graph showing a thickness dependence of the correlation characteristic between the stress voltage and the stress time until a current flowing through the upper electrode in the non-volatile variable resistive element becomes a constant compliance current. As shown in FIG. 19, in a case where the same metal is used for the upper electrode 1002, when the thickness of the variable resistive layer 1004 becomes thin (thinning), the stress voltage being necessary for reaching a constant compliance current or turning into a data-holding state (set-state or on-state) becomes small, and the stress time becomes short.

FIGS. 20 and 21 show evaluation results indicating the number of occurrences (number of counts) of stress effect at the minimum stress voltage (critical voltage) observed by changing the stress voltage during the certain period under a case where a material of the upper electrode is varied among different metals while the thickness of the variable resistive layer is made constant in the evaluations shown in FIGS. 13 and 14. In FIG. 20, Ag is used for the upper electrode, and in FIG. 20, Ni is used for the upper electrode 1002.

As is clear from the evaluation results indicated by statistics distribution shown in FIGS. 20 and 21, a distribution of the minimum stress voltage in the case using Ni as an electrode material shifts toward a higher voltage side than the case using Ag as the electrode material. As described above, the minimum stress voltage (critical voltage) depends on a kind of metal used for the electrode.

By arranging the thickness between the first electrode 102 and the third electrode 105 and the thickness between the second electrode 103 and the third electrode 105 while selecting the metal material to be used for the first electrode 102 and the second electrode 103 based on the characteristics shown in FIGS. 19 to 21 as examples, it is possible to adjust the characteristic curves of stress effect with respect to the electrodes so that they intercross to form a cross point as shown in FIG. 4.

Next, a method of manufacturing the non-volatile variable resistive element 100 according to the first embodiment will be described in detail with accompanying drawings. In the following description, a case where Ag is used for the first electrode 102, Ni is used for the second electrode 103, a p-type polysilicon is used for the third electrode 105 and an amorphous silicon is used for the variable resistive layer 104 will be described as an example.

Figure 22:
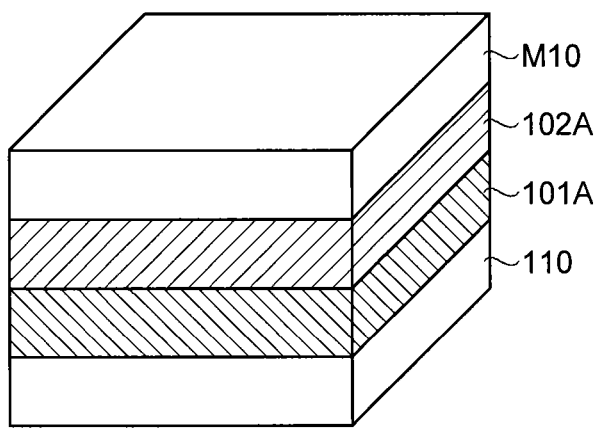
FIG. 22 is an illustration showing a production method of the non-volatile variable resistive element according to the first embodiment (phase 1)

Firstly, as shown in FIG. 22, by a lower wiring layer 101A being deposited on a monocrystalline silicon substrate 110 and Ag being deposited on the lower wiring layer 101A using a chemical vapor deposition (CVD) method, a first metal layer 102A is formed. On the first metal layer 102A, a mask layer M10 such as a silicon oxide is deposited. A material of the mask layer M10 may be selected based on an etching selectivity between the first metal layer 102A and the mask layer M10, for instance. The lower wiring layer 101A may be a solid film before being processed into the lower wiring 101.

Figure 23:
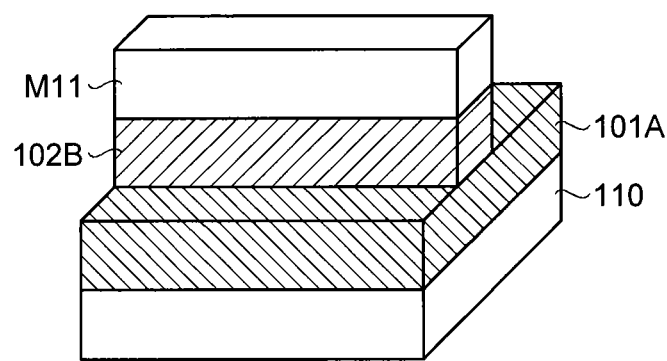
FIG. 23 is an illustration showing the production method of the non-volatile variable resistive element according to the first embodiment (phase 2)

Next, by conducting a photolithography and etching process, for example, the mask layer M10 is processed into a mask pattern M11, and then by dry-etching the first metal layer 102A using the mask pattern M11, the first metal layer 102A is processed into a first electrode 102B as shown in FIG. 23.

Figure 24:
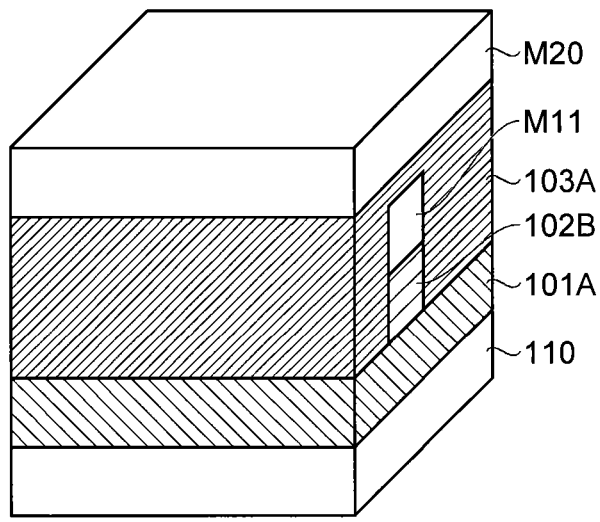
FIG. 24 is an illustration showing the production method of the non-volatile variable resistive element according to the first embodiment (phase 3)

Next, as shown in FIG. 24, by depositing Ni on the lower wiring layer 101A using the CVD method, a second metal layer 103A is formed. In this process, the second metal layer 103A may be deposited so that the first electrode 102B and the mask pattern M11 are buried in the second metal layer 103A. On the second metal layer 103A, a mask layer M20 such as a silicon oxide is deposited. A material of the mask layer M20 may be selected based on an etching selectivity between the second metal layer 103A and the mask layer M20, for instance.

Figure 25:
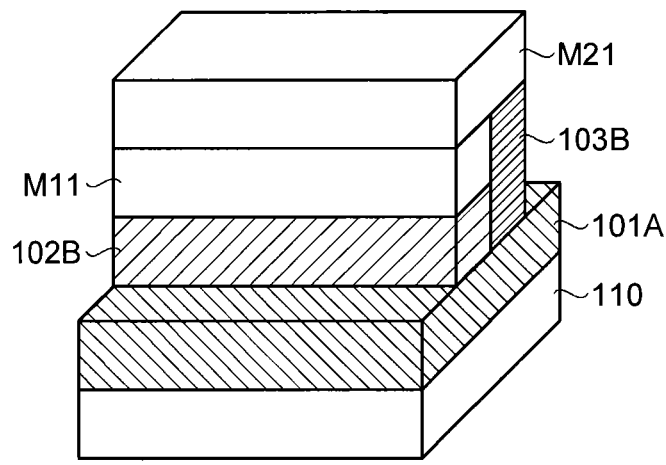
FIG. 25 is an illustration showing the production method of the non-volatile variable resistive element according to the first embodiment (phase 4)

Next, by conducting a photolithography and etching process, for example, the mask layer M20 is processed into a mask pattern M21, and then, by dry-etching the second metal layer 103A using the mask pattern M21, the second metal layer 103A is processed into a second electrode 103B as shown in FIG. 25.

Figure 26:
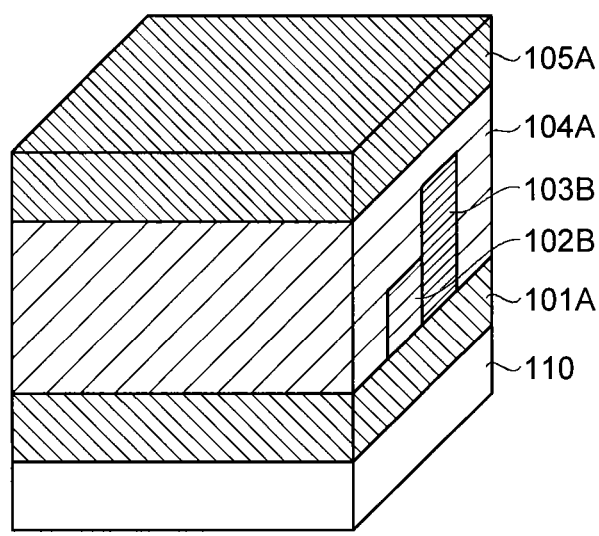
FIG. 26 is an illustration showing the production method of the non-volatile variable resistive element according to the first embodiment (phase 5)
Figure 27:
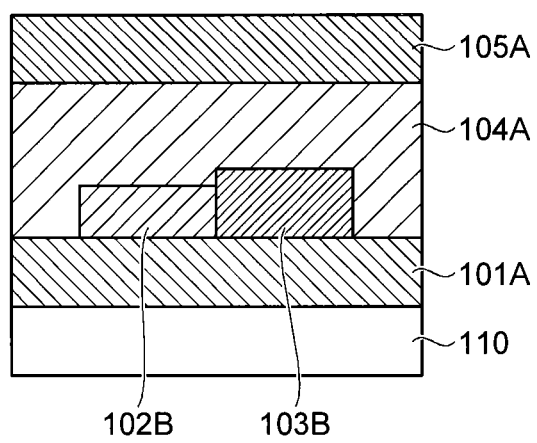
FIG. 27 is an illustration showing the production method of the non-volatile variable resistive element according to the first embodiment (phase 6)

Next, after removing the mask patterns M11 and M21, as shown in FIGS. 26 and 27, using the CVD method, an amorphous silicon layer 104A is deposited on the first electrode 102B and the second electrode 103B, and a polysilicon 105A is deposited on the amorphous silicon layer 104A.

Next, dopants such as boron ions ($B^+$) are doped to the polysilicon 105A, and then by conducting an activation anneal on the polysilicon 105A, the polysilicon 105A is changed into a p-type polysilicon 105A.

Figure 28:
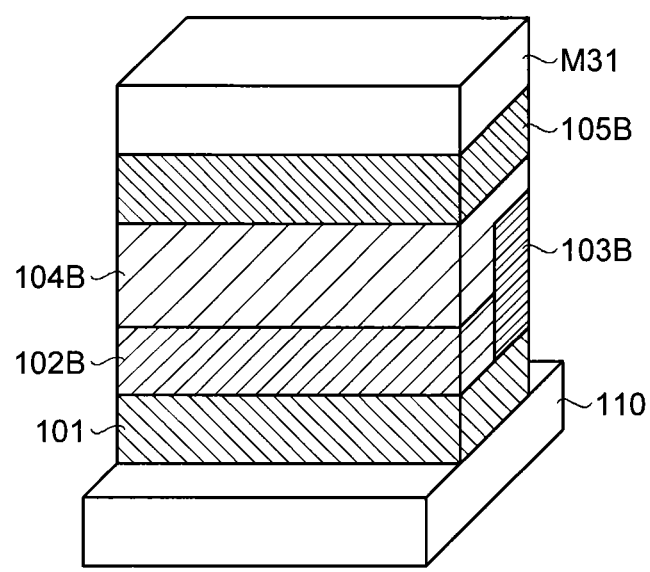
FIG. 28 is an illustration showing the production method of the non-volatile variable resistive element according to the first embodiment (phase 7)
Figure 29:
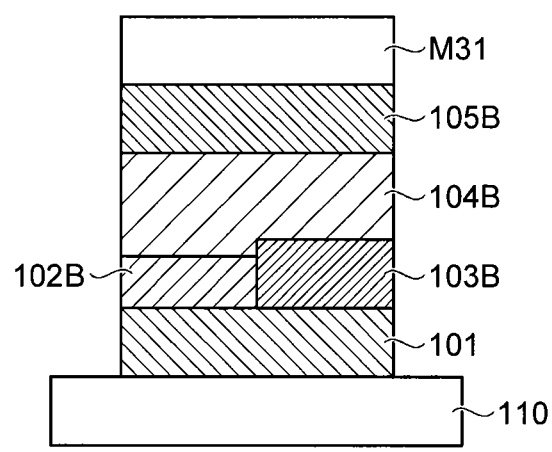
FIG. 29 is an illustration showing the production method of the non-volatile variable resistive element according to the first embodiment (phase 8)
Figure 30:
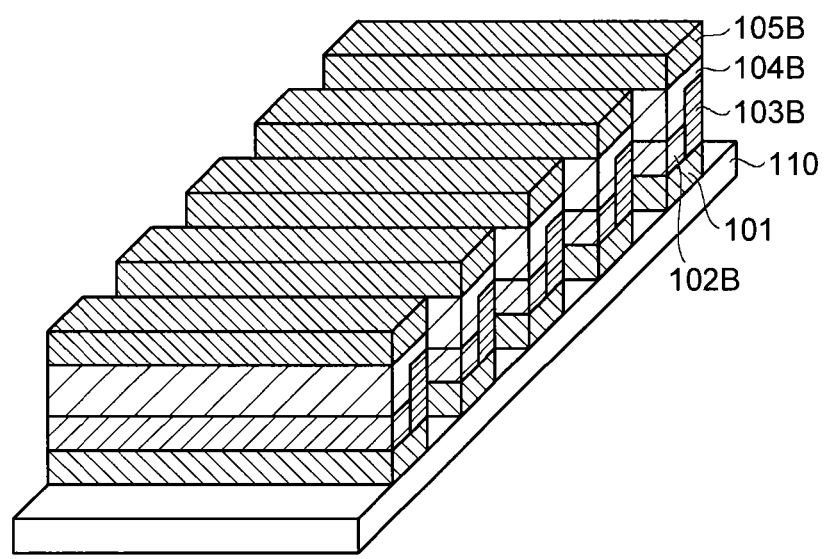
FIG. 30 is an illustration showing the production method of the non-volatile variable resistive element according to the first embodiment (phase 9)

Next, by depositing a mask layer (not shown) such a silicon oxide on the p-type polysilicon 105A and conducting a photolithography and etching process, the mask layer is processed into a mask pattern M31. Then, by dry-etching the layers from the p-type polysilicon 105A to the lower wiring layer 101A using the mask pattern M31, as shown in FIGS. 28 and 29, the p-type polysilicon 105A is processed into a third electrode 105B, the amorphous silicon layer 104A is processed into a variable resistive layer 104B, and the lower wiring layer 101A is processed into the lower electrode 101. By such processes, on the monocrystalline silicon substrate 110, as shown in. FIG. 30, an element structure array of the non-volatile variable resistive element 100 before being cut off in a drawing direction of the upper wiring 106 is formed.

Figure 31:
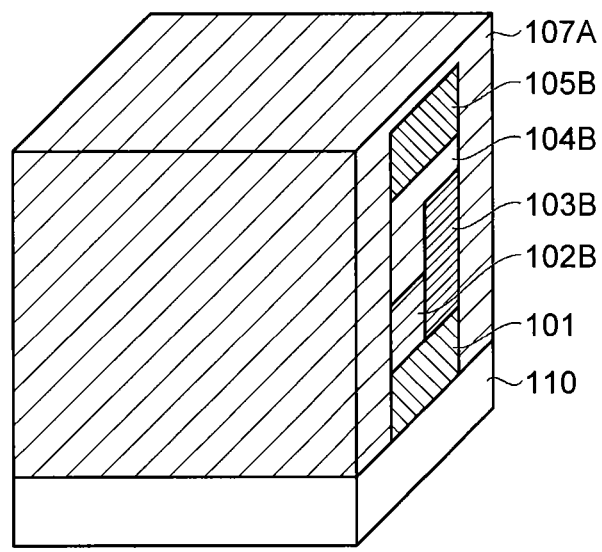
FIG. 31 is an illustration showing the production method of the non-volatile variable resistive element according to the first embodiment (phase 10)
Figure 32:
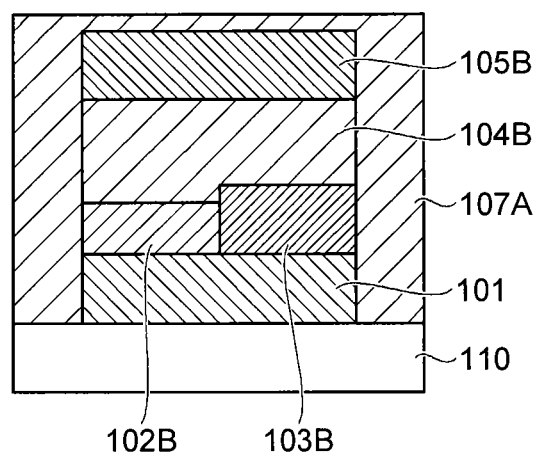
FIG. 32 is an illustration showing the production method of the non-volatile variable resistive element according to the first embodiment (phase 11)

Next, as shown in FIGS. 31 and 32, by depositing oxide using the CVD method, for instance, an insulator 107A burying a mesa structure constructed from the lower wiring 101, the first electrode 102B, the second electrode 103B, the variable resistive layer 104B and the third electrode 105B is formed.

Figure 33:
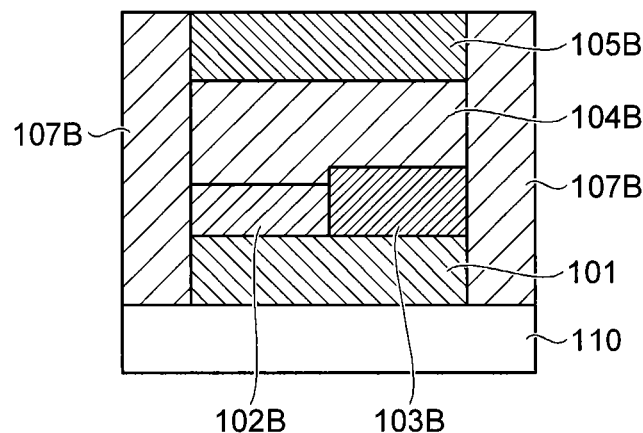
FIG. 33 is an illustration showing the production method of the non-volatile variable resistive element according to the first embodiment (phase 12)
Figure 34:
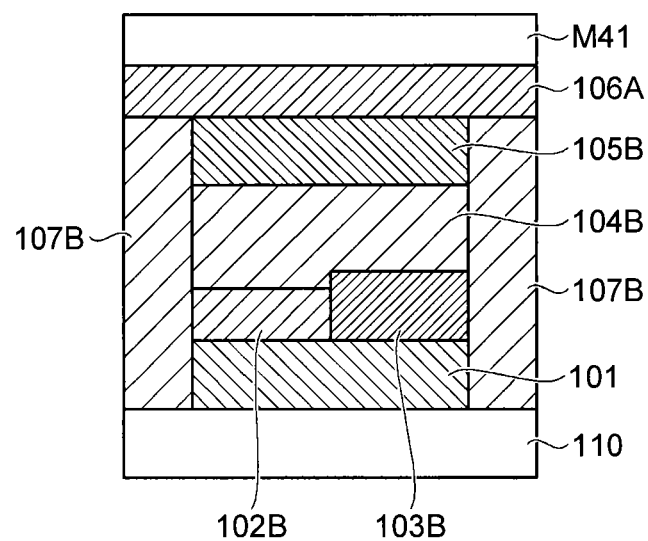
FIG. 34 is an illustration showing the production method of the non-volatile variable resistive element according to the first embodiment (phase 13)

Next, as shown in FIG. 33, by polishing a surface of the insulator 107 using a chemical mechanical polishing (CMP), or the like, a surface of an insulator 107B is planarized while an upper surface of the third electrode 105B is exposed. Next, as shown in FIG. 34, by the CVD method, an upper wiring layer 106A is deposited on the insulator 107B and the third electrode 105B. Then, a mask layer such as a silicon oxide is deposited on the upper wiring layer 106A, and the mask layer is processed into a mask pattern M41 by conducting a photolithography and etching process, or the like. The mask pattern M41 is a pattern extending in a direction perpendicular to the extending direction of the lower wiring 101, for instance.

Figure 35:
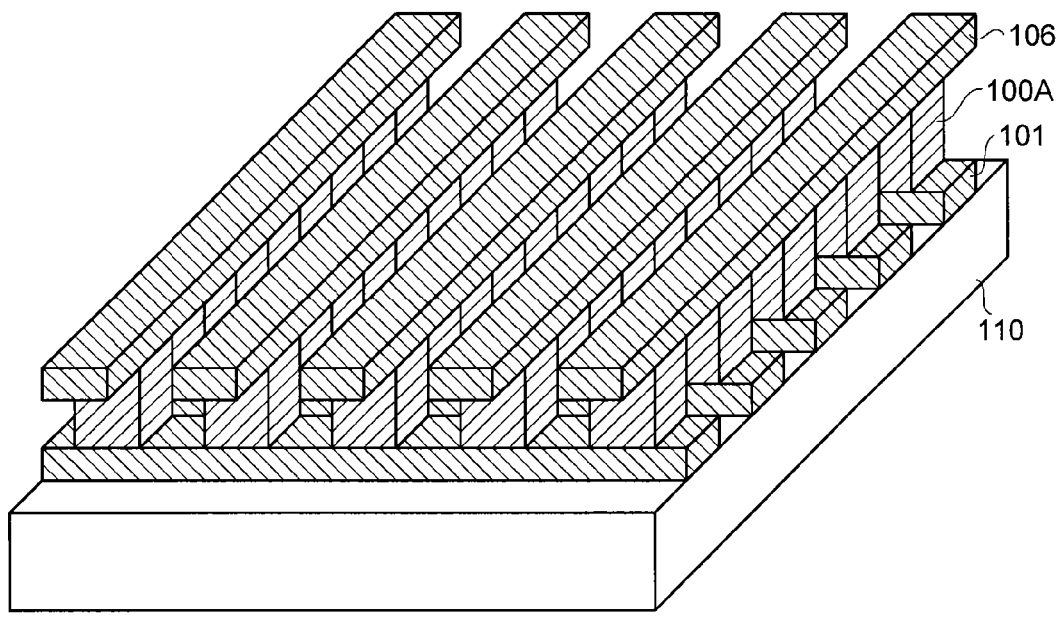
FIG. 35 is an illustration showing the production method of the non-volatile variable resistive element according to the first embodiment (phase 14)

Next, the insulator 107B, the upper wiring layer 106A, the third electrode 105B, the variable resistive layer 104B, the first electrode 102B and the second electrode 103B are dry-etched. Thereby, as shown in FIG. 35, the upper wiring layer 106A is processed into the upper wirings 106 extending in a direction crossing the lower electrodes 101, and element portions 100A of the non-volatile variable resistive elements 100 each of which is constructed from the first electrode 102, the second electrode 103, the variable resistive layer 104 and the third electrode 105 are formed at the cross points of the lower wirings 101 and the upper wirings 106. After that, by embedding insulators between the element portions 100A and the upper wirings 106 as necessary, the non-volatile variable resistive element 100 according to the first embodiment is manufactured. In FIG. 35, the insulator 107 is omitted.

Next, a method of driving a storage device 1 having the memory cell array 10 in which the non-volatile variable resistive elements 100 are arrayed two-dimensionally will be described in detail.

Figure 36:
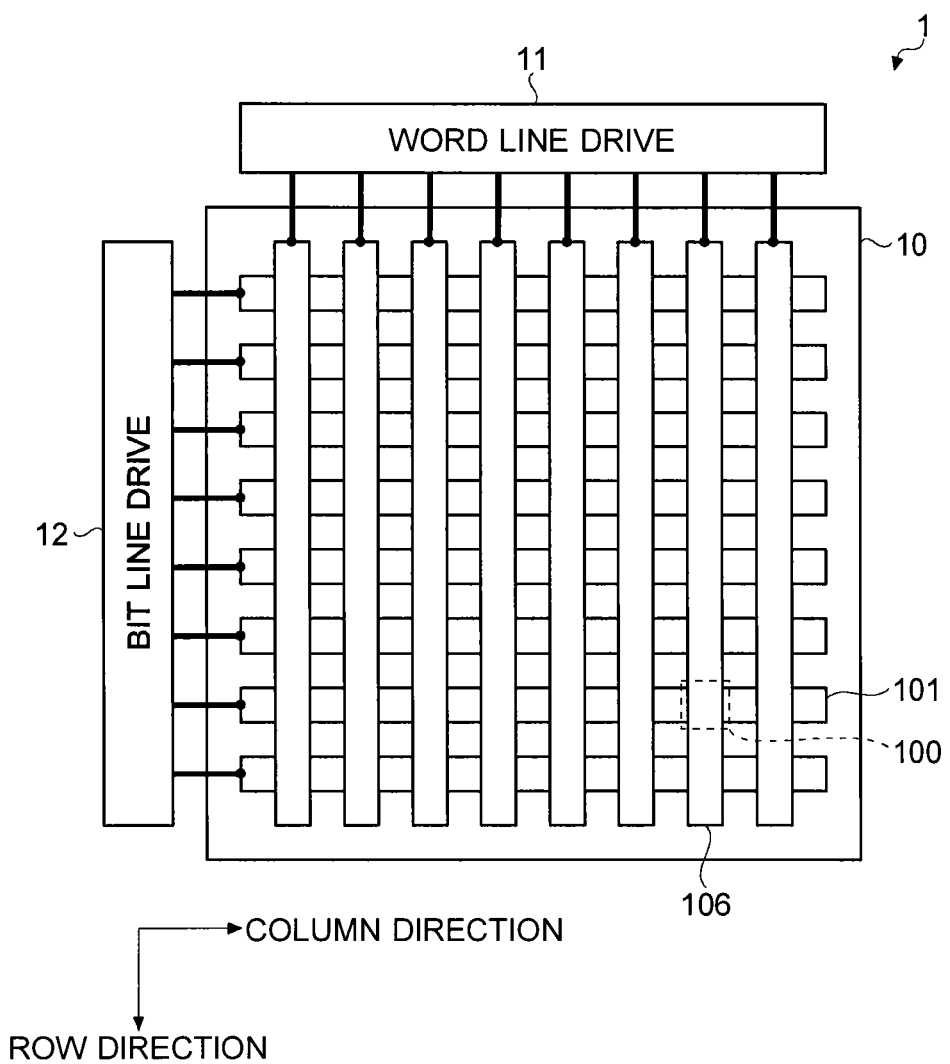
FIG. 36 is a horizontal sectional view of the storage device according to the first embodiment.

FIG. 36 is a horizontal sectional view of the storage device according to the first embodiment. In FIG. 36, the upper wirings 106 extending in a row direction correspond to word lines, and the lower wirings 101 extending in a column direction correspond to bit lines. Each non-volatile variable resistive element 100 is located at a crossing portion between each lower wiring 101 and upper wiring 106, which corresponds to a cross points between each word line and bit line. To the upper wirings 106 corresponding to the word lines, a word line drive 11 for row-selection is connected, and to the lower wirings 101 corresponding to the bit lines, a bit line drive 12 for column-selection is connected.

Figure 37:
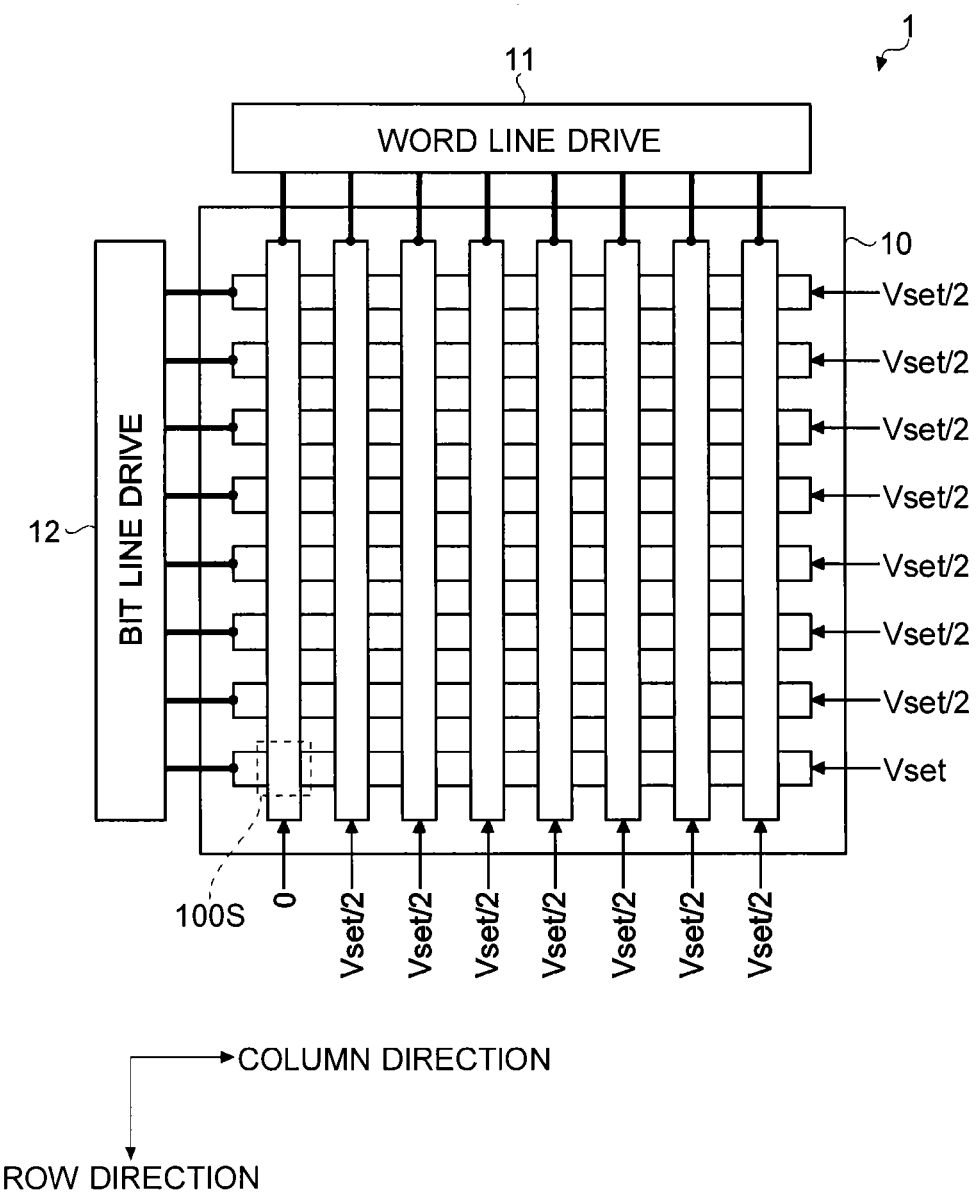
FIG. 37 is an illustration showing an example of operation for writing data in a selected cell in a structure shown in FIG. 36.

FIG. 37 is an illustration showing an example of operation for writing data in a selected cell in a structure shown in FIG. 36. As shown in FIG. 37, when data writing directed to a selected cell 100S is performed, a set voltage Vset is applied to a lower wiring 101 being a selected column, and a half of the set voltage Vset is applied to the lower wirings 101 being non-selected columns. Furthermore, 0V is applied to an upper wiring 106 being a selected row, and a half of the set voltage Vset is applied to the upper wirings 106 being non-selected rows. Here, the set voltage is the stress voltage Vset1 or Vset2 described above.

Thereby, to the selected cell 100S assigned by the selected column and the selected row, the readout voltage Vread is applied. As a result, data readout from the selected cell 100S is performed. On the other hand, to the half-selected cells assigned by the non-selected columns and the selected row, a negative half of the readout voltage Vread is applied. Therefore, data readout from these half-selected cells is forbidden. Likewise, due to a half of the readout voltage Vread being applied to the half-selected cells assigned by the selected column and the non-selected rows, data readout from these half-selected cells is forbidden. Furthermore, due to 0V being applied to the non-selected cells assigned by the non-selected columns and the non-selected rows, data readout from these non-selected cells is forbidden.

Figure 38:
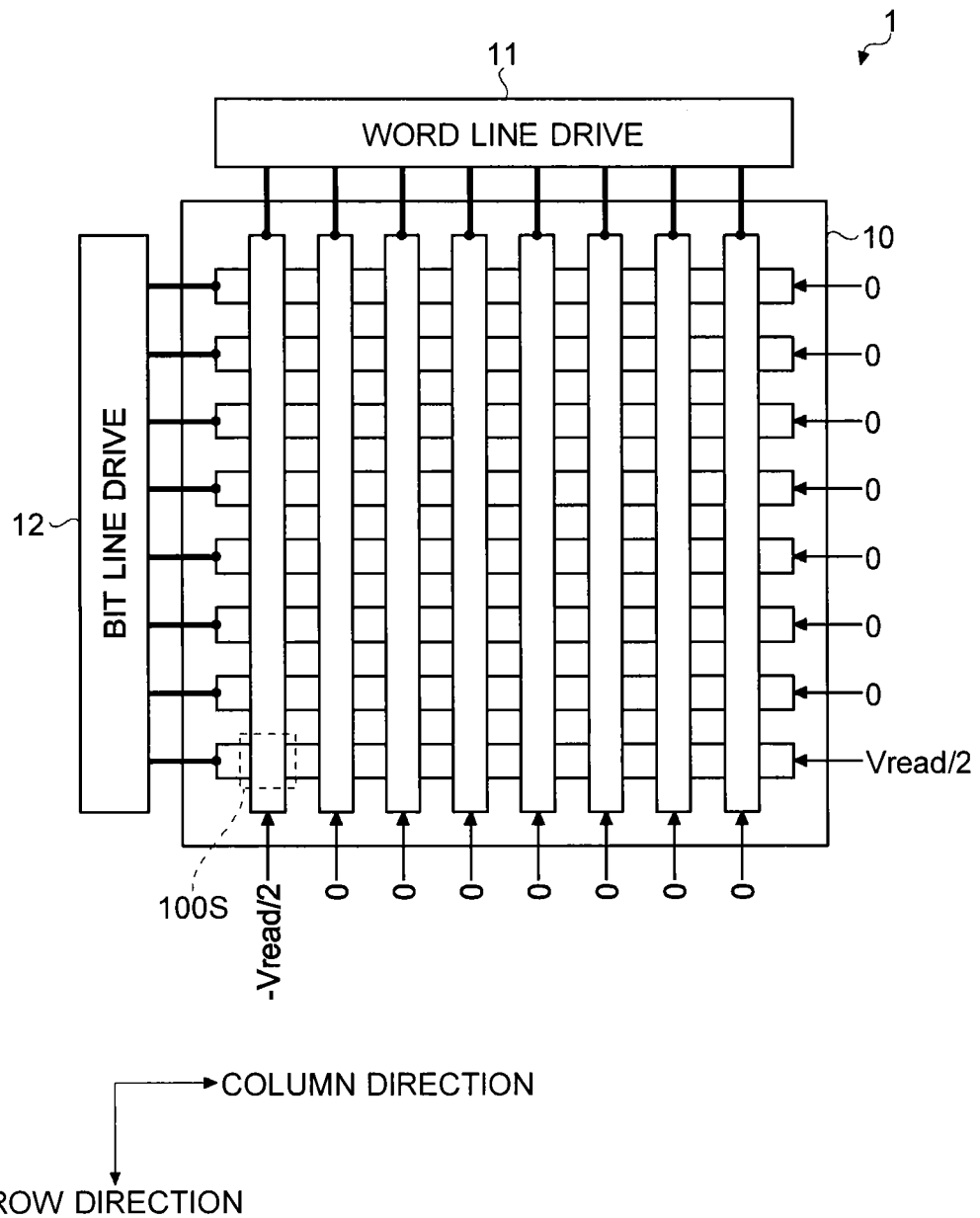
FIG. 38 is an illustration showing an example of operation for reading out data from a selected cell in the structure shown in FIG. 36.

FIG. 38 is an illustration showing an example of operation for reading out data from a selected cell in the structure shown in FIG. 36. As shown in FIG. 38, when data readout from the selected cell 100S is performed, a half of the readout voltage Vread is applied to the lower wiring 101 being the selected column, and 0V is applied to the lower wirings 101 being the non-selected columns. Furthermore, a negative half of the readout voltage Vread is applied to the upper wiring 106 being the selected row, and 0V is applied to the upper wirings 106 being the non-selected rows.

Thereby, to the selected cell 100S assigned by the selected column and the selected row, the readout voltage Vread is applied. As a result, data readout from the selected cell 100S is performed. On the other hand, to the half-selected cells assigned by the non-selected columns and the selected row, a negative half of the readout voltage Vread is applied. Therefore, data readout from these half-selected cells is forbidden. Likewise, due to a half of the readout voltage Vread being applied to the half-selected cells assigned by the selected column and the non-selected rows, data readout from these half-selected cells is forbidden. Furthermore, due to 0V being applied to the non-selected cells assigned by the non-selected columns and the non-selected rows, data readout from these non-selected cells is forbidden.

Figure 39:
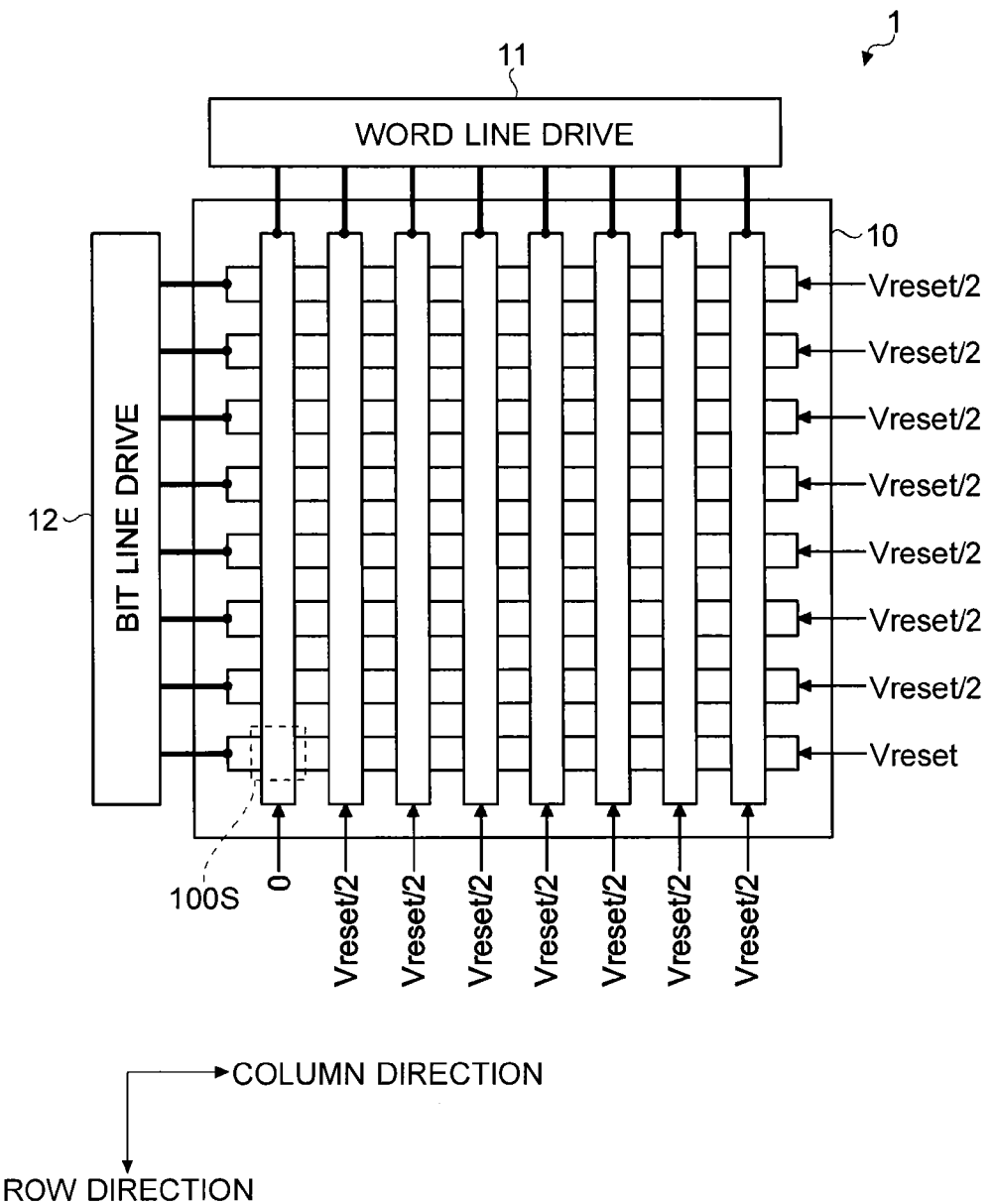
FIG. 39 is an illustration showing an example of operation for erasing data stored in a selected cell in the structure shown in FIG. 36.

FIG. 39 is an illustration showing an example of operation for erasing data stored in a selected cell in the structure shown in FIG. 36. As shown in FIG. 39, when data erase with respect to the selected cell 100S is performed, the reset voltage Vreset is applied to the lower wiring 101 being the selected column, and a half of the reset voltage Vreset is applied to the lower wirings 101 being the non-selected columns. Furthermore, 0V is applied to the upper wiring 106 being the selected row, and a half of the reset voltage Vreset is applied to the upper wirings 106 being the non-selected rows.

Thereby, to the selected cell 100S assigned by the selected column and the selected row, the reset voltage Vreset is applied. As a result, data erase with respect the selected cell 100S is performed. On the other hand, to the half-selected cells assigned by the non-selected columns and the selected row, a half of the reset voltage Vreset is applied. Therefore, data erase with respect to these half-selected cells is forbidden. Likewise, due to a half of the reset voltage Vreset being applied to the half-selected cells assigned by the selected column and the non-selected rows, data erase with respect to these half-selected cells is forbidden. Furthermore, due to 0V being applied to the non-selected cells assigned by the non-selected columns and the non-selected rows, data erase with respect to these non-selected cells is forbidden.

Next, an example of driving for switching an operation mode for each region in the memory cell array 10 is described in detail with the accompanying drawings.

Figure 40:
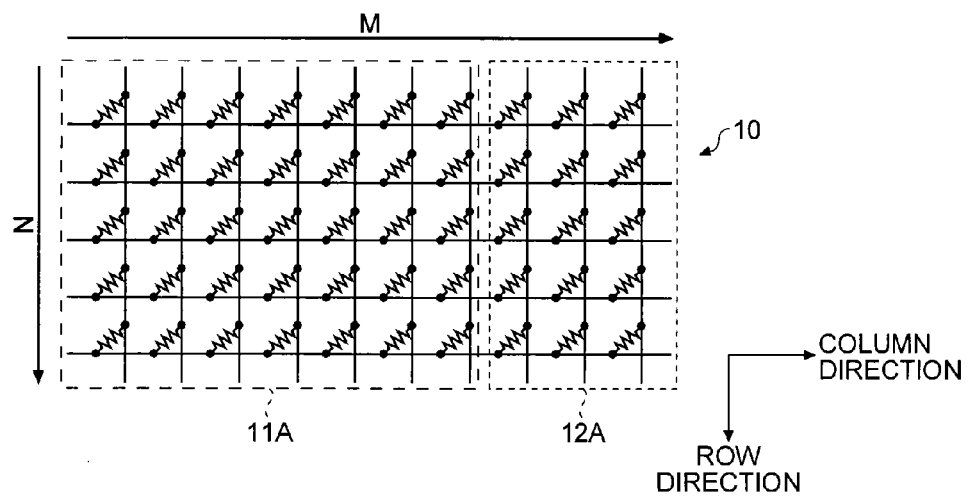
FIG. 40 is an illustration for explaining a case where an operation mode of an m-row-n-column memory cell array according to the first embodiment is switched by every region.
Figure 41:
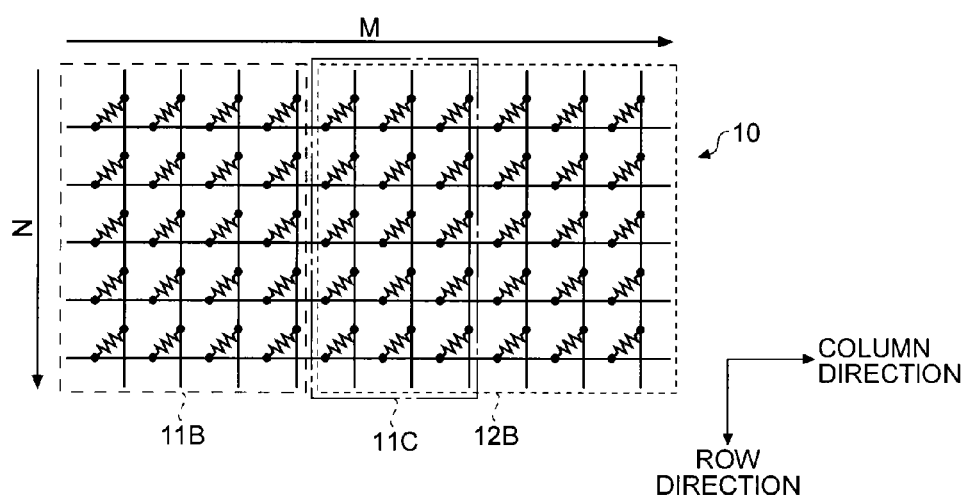
FIG. 41 is an illustration for explaining switching of the regions shown in FIG. 40.

FIG. 40 is an illustration for explaining a case where an operation mode of an m-row-n-column memory cell array is switched by every region. FIG. 41 is an illustration for explaining switching of the regions shown in FIG. 40. As shown in FIG. 40, in the first embodiment, it is possible to arrange such that a region 11A being a part of the memory cell array 10 is driven in the mode P1 and a remaining region 12A is driven in the mode P2. Furthermore, as shown in FIGS. 40 and 41, it is possible to design such that by switching the operation mode of a region 11C being a part of the region 11A driven in the mode P1 from the mode P1 to the mode P2, consequently let a region 11B drive in the mode P1 and a region 12B drive in the mode P2.

Figure 42:
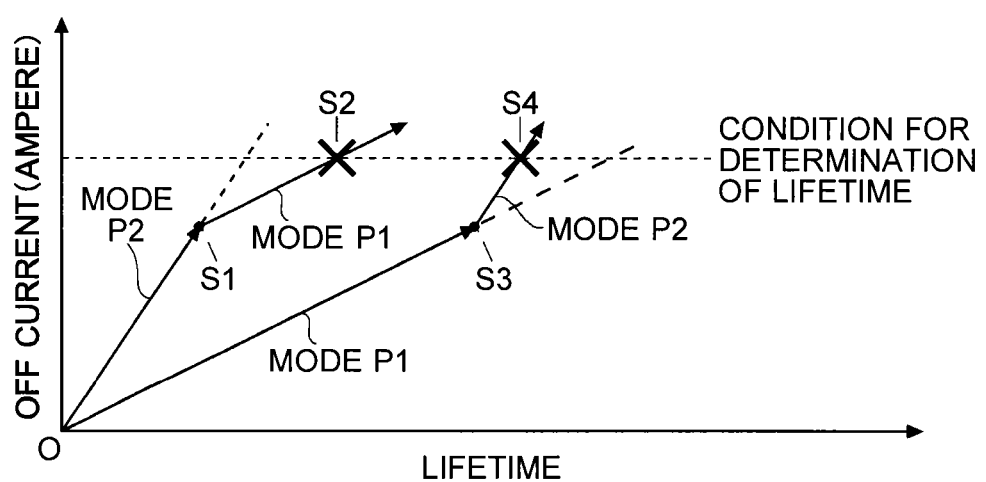
FIG. 42 is an illustration showing an example of a determination condition for switching between two modes according to the first embodiment.

FIG. 42 is an illustration showing an example of a determination condition for switching between the mode P1 and the mode P2. Here, in FIG. 42, an origin O is a beginning point of use of the storage device 1, points S1 to S4 are mid points in use. For example, in a case where the access speed and the data-holding characteristic are to be emphasized, the storage device 1 is driven in the mode P2 during a period starting from the origin O to the point S1, and then the storage device 1 is driven in the mode P1 until the storage device 1 reaches the end of life (point P2). Thereby, comparing a case where the storage device 1 is driven only in the mode P2, it is possible to extend the longevity of the storage device 1. Furthermore, when the longevity of the storage device 1 from the beginning of use thereof is to be emphasized, it is possible to drive the storage device 1 from the origin O. In this case, depending on a usage situation, it is possible to switch the operation mode to the mode P2 (point S3 to point S4).

For example, when the storage device 1 is used as a mass storage device, the data-holding characteristic may be emphasized rather than the access speed. In such case, it is preferable that whole or at least a part of the storage device 1 is driven in the mode P1 with a good data-holding characteristic. Furthermore, when the permanency (number of cycles) is to be emphasized, it is preferable that whole or a part of the storage device 1 is driven in the mode P1 with a comparatively good permanency.

In addition, it is also acceptable that the operation mode of the storage device 1 is freely selected by a user. For instance, switch for switching the operation mode can be mounted on an outer housing of the storage device 1. It is also possible that a device driver for the storage device 1 is provided so that a user can set the operation mode using the device driver installed on an information processing device such as a personal computer connected to the storage device 1.

Next, a method of switching between the mode P1 and the mode P2 will be described. In the structure shown in FIG. 36, for instance, a controller including the word line drive 11 and the bit line drive 12 applies a set voltage of 2 to 2.5 V between the upper wiring 106 and the lower wiring 101 based on a driving conditions of the mode P1. Then, Ag elements being the first metal are diffused and ionized into the variable resistive layer 104 from the first electrode 102 toward the third electrode 105, whereby, the conductive filament 108 made of Ag is formed in the variable resistive layer 104.

Furthermore, at the controller, a limit to a number of uses of the third electrode 105 is being previously set. When the number of use of the third electrode 105 is reached to the limit, the controller applies a set voltage with 6 to 6.5 V between the upper wiring 106 and the lower wiring 101 based on a driving conditions of the mode P2. Then, Ni elements being the second metal are diffused and ionized into the variable resistive layer 104 from the second electrode 103 toward the third electrode 105, whereby, the conductive filament 118 made of Ni is formed in the variable resistive layer 104. As described above, data writing in the mode P1 and data writing in the mode P2 are alternately switched.

The mode P1 and the mode P2 can be switched based on a value of current flowing between the upper wiring 106 and the lower wiring 101. In this case, the controller detects a value of current flowing between the upper wiring 106 and the lower wiring 101 at a time when the set voltage of 2 to 2.5 V is applied between the upper wiring 106 and the lower wiring 101 based on the driving conditions of the mode P1. Here, an off-state current flowing between the upper wiring 106 and the lower wiring 101 at the off-state (data erasure) is defined as Ioff, an on-state current flowing between the upper wiring 106 and the lower wiring 101 at the on-state (data write) is defined as Ion. The controller calculates a ratio (Ion/Ioff) of the on-state current Ion and the off-state current Ioff. For example, when the ratio Ion/Ioff is equal to or less than 10, the controller determines that the conductive filament 108 is difficult to be formed in the variable resistive layer 104. Therefore, the controller applies the set voltage of 6 to 6.5 V between the upper wiring 106 and the lower wiring 101 based on the driving conditions of the mode P2. As described above, data writing in the mode P1 and data writing in the mode P2 are alternately switched.

Moreover, it is also acceptable that the mode P1 and the mode P2 are switched based on the on-state current Ion. That is, when the on-state Ion current is sufficiently large, the controller applies the set voltage of 2 to 2.5 V between the upper wiring 106 and the lower wiring 101 based on the driving conditions of the mode P1, and when the on-state current Ion is extremely small, the controller applies the set voltage of 6 to 6.5 V between the upper wiring 106 and the lower wiring 101 based on the driving conditions of the mode P2. As described above, data writing in the mode P1 and data writing in the mode P2 are alternately switched. Here, the extremely small on-state current Ion may be defined as less than one tenth of a normal current at a normal operation, for instance.

As described above, in the first embodiment, the ReRAM element with the ion-memory-cell structure using the metal element filament (conductive filament) has at least two kinds of metal electrodes or alloy electrodes in the single element structure. Each conductive filament formed by a certain electrode has a different characteristic from the other conductive filaments formed by other electrodes. A distance between each metal electrode and the electrode may be different or the same. By properly selecting the conductive filament with such different characteristic based on the operation sequence, it is possible to extend longevity of the storage device 1, and furthermore, it is possible to freely design a data-holding preferred cell array region and a number-of-cycles preferred cell array region. Moreover, it is possible to redesign both of the regions while in use.

Second Embodiment

Next, a non-volatile variable resistive element, a controlling device, a storage device and a method of controlling the non-volatile variable resistive element according to a second embodiment will be explained below in detail with reference to the accompanying drawings. In the second embodiment, another example of the non-volatile variable resistive element will be described. In the following, as for the same structures as the above-described embodiment, the same reference numbers will be applied and redundant explanations will be omitted.

Figure 43:
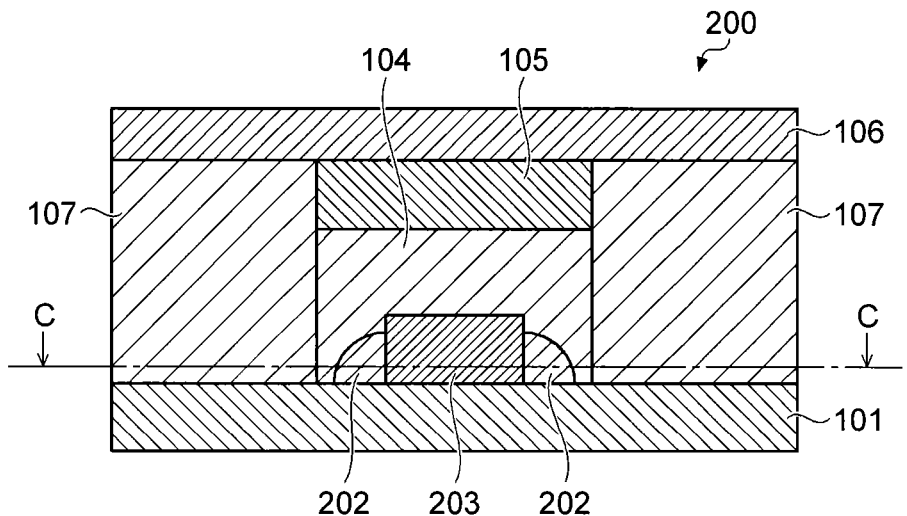
FIG. 43 is a vertical sectional view of a non-volatile variable resistive element according to a second embodiment when the non-volatile variable resistive element is cut in a direction of stack.
Figure 44:
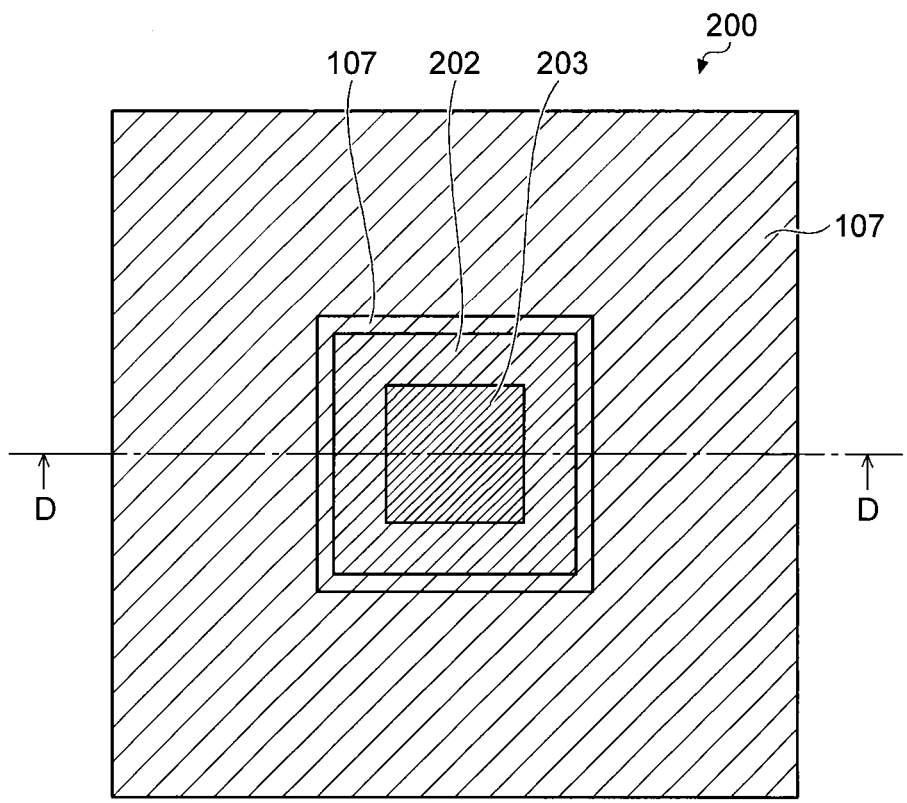
FIG. 44 is a horizontal sectional view of the non-volatile variable resistive element according to the second embodiment.

FIGS. 43 and 44 show an example of an outline structure of a non-volatile variable resistive element according to the second embodiment. FIG. 43 shows a vertical sectional view of a non-volatile variable resistive element 200 according to the second embodiment when the non-volatile variable resistive element 200 is cut in a direction of stack. FIG. 44 shows a horizontal sectional view of the non-volatile variable resistive element 200 according to the second embodiment. Here, FIG. 43 shows a D-D cross-section structure in FIG. 44, and FIG. 44 shows a C-C cross-section structure in FIG. 43.

As is clear from a comparison between FIGS. 43 and 44 and FIGS. 2 and 3, the non-volatile variable resistive element 200 according to the second embodiment has the same structure as the non-volatile variable resistive element 100 according to the first embodiment except that the first electrode 102 and the second electrode 103 are replaced with a first electrode 202 and a second electrode 203, respectively. The first electrode 202 is located at a center of a bottom of a hole surrounded by the insulator 107, for instance. The second electrode 203 is located at sides of the first electrode 202, for instance. Here, both the first electrode 202 and the second electrode 203 contact the lower wiring 101.

Also according to such structure as above, it is possible to obtain the same effects as the first embodiment. Because the other structures and operations are the same as the above-described embodiment, the detailed descriptions are omitted here.

Third Embodiment

Next, a non-volatile variable resistive element, a controlling device, a storage device and a method of controlling the non-volatile variable resistive element according to a third embodiment will be explained below in detail with reference to the accompanying drawings. In the third embodiment, still another example of the non-volatile variable resistive element will be described. In the following, as for the same structures as the above-described embodiments, the same reference numbers will be applied and redundant explanations will be omitted.

Figure 45:
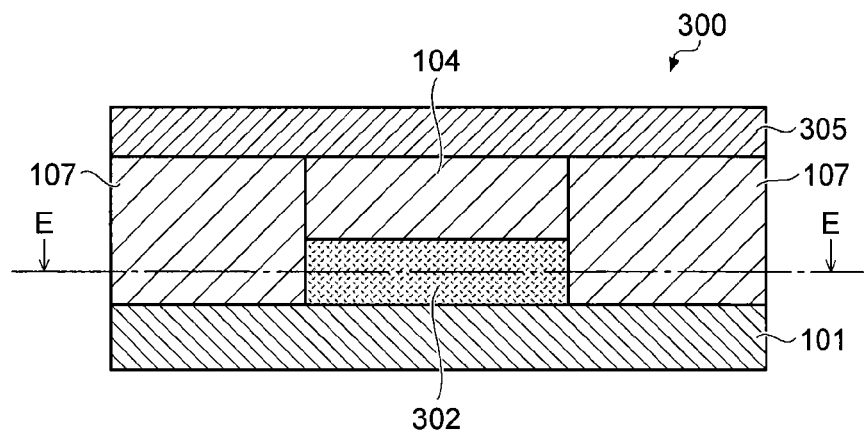
FIG. 45 is a vertical sectional view of a non-volatile variable resistive element according to a third embodiment when the non-volatile variable resistive element is cut in a direction of stack.
Figure 46:
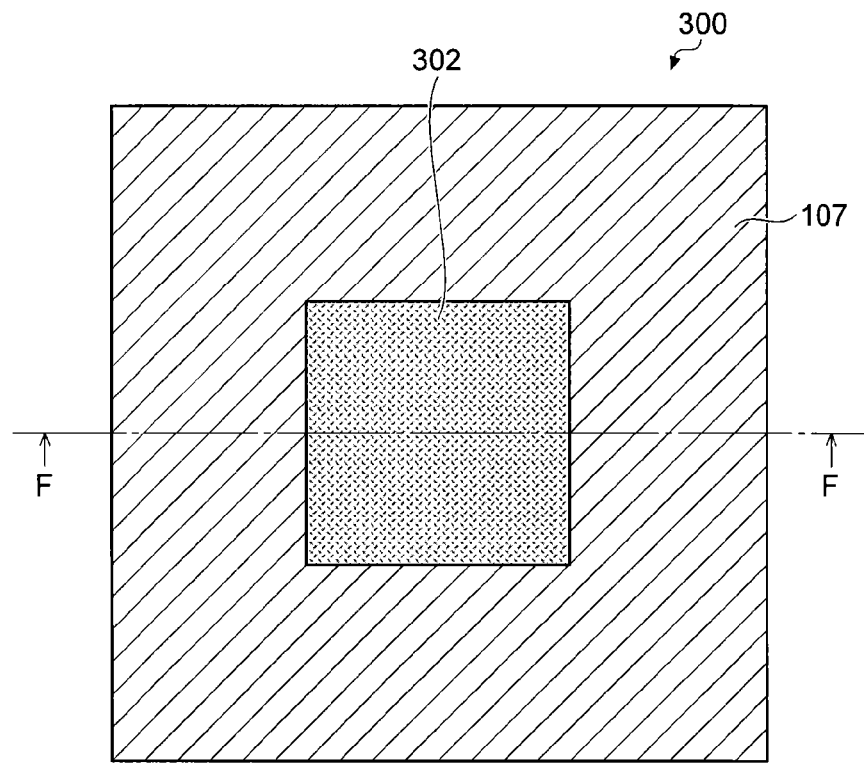
FIG. 46 is a horizontal sectional view of the non-volatile variable resistive element according to the third embodiment.

FIGS. 45 and 46 show an example of an outline structure of a non-volatile variable resistive element according to the third embodiment. FIG. 45 shows a vertical sectional view of a non-volatile variable resistive element 300 according to the third embodiment when the non-volatile variable resistive element 300 is cut in a direction of stack. FIG. 46 shows a horizontal sectional view of the non-volatile variable resistive element 300 according to the third embodiment. Here, FIG. 45 shows a F-F cross-section structure in FIG. 46, and FIG. 46 shows a E-E cross-section structure in FIG. 45.

As is clear from a comparison between FIGS. 45 and 46 and FIGS. 2 and 3, the non-volatile variable resistive element 300 according to the third embodiment has the same structure as the non-volatile variable resistive element 100 according to the first embodiment except that the first electrode 102 and the second electrode 103 are replaced with a single lower electrode 302. Furthermore, instead of the third electrode 105 and the upper wiring 106, an upper electrode wiring 305 combining the two is mounted.

The lower electrode 302 includes an alloy constructed from a plurality of kinds of metal elements each of which is able to form a different conductive filament (e.g. the conductive filament 108 or 118) having a different characteristic in a different operation mode (e.g. the modes P1 and P2). As for materials of the alloy, for instance, Ag, Au, Ti, Ni, Co, Al, Fe, Cr, Cu, W, Hf, Ta, Pt, Ru, Zr, Ir, or the like, can be applied. The upper electrode wiring 305 can be made using the same material as the third electrode 105, for instance.

Also according to such structure as above, it is possible to obtain the same effects as the above-described embodiments. Because the other structures and operations are the same as the above-described embodiments, the detailed descriptions are omitted here.

Next, a method of manufacturing the non-volatile variable resistive element 300 according to the third embodiment will be described in detail with accompanying drawings.

Figure 47:
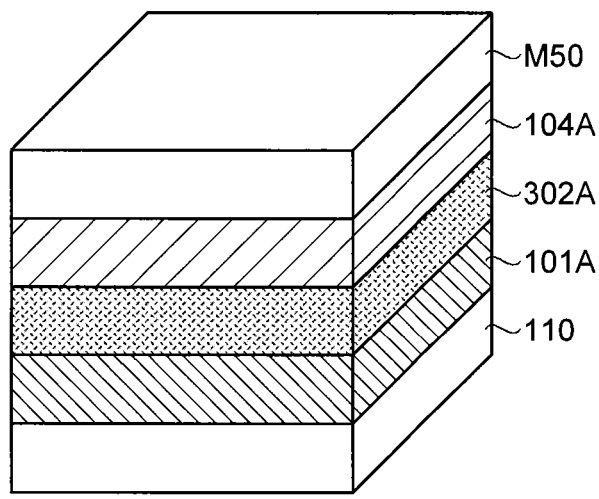
FIG. 47 is an illustration showing a production method of the non-volatile variable resistive element according to the third embodiment (phase 1)

Firstly, as shown in FIG. 47, using the CVD method, the lower wiring layer 101A, a metal alloy layer 302A used for the first electrode 202, and an amorphous silicon layer 104A used for the variable resistive layer 104 are serially deposited on the monocrystalline silicon substrate 110. Furthermore, on the amorphous silicon layer 104A, a mask layer M50 such as a silicon oxide is deposited.

Figure 48:
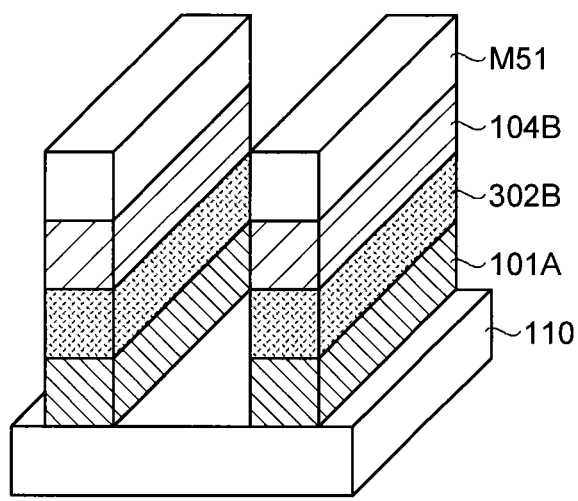
FIG. 48 is an illustration showing the production method of the non-volatile variable resistive element according to the third embodiment (phase 2)

Next, by conducting a photolithography and etching process, for example, the mask layer M50 is processed into a mask pattern M51, and then by dry-etching the layers from the amorphous silicon layer 104A to the lower wiring layer 101A using the mask pattern M51, the amorphous silicon layer 104A and the metal alloy layer 302A are processed into the variable resistive layer 104B and an upper electrode 302B while the lower wiring layer 101A is processed into the lower electrode 101 as shown in FIG. 48.

Figure 49:
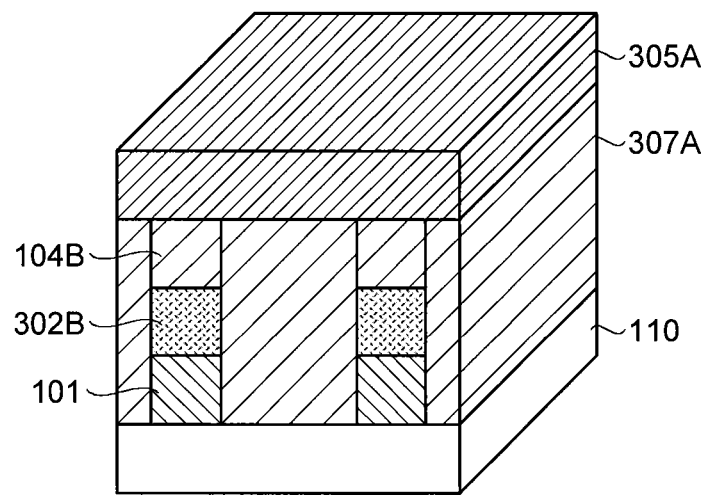
FIG. 49 is an illustration showing the production method of the non-volatile variable resistive element according to the third embodiment (phase 3)

Next, by depositing oxide using the CVD method, a insulator 307A burying a mesa structure constructed from the lower wiring 101, the lower electrode 302B and the variable resistive layer 104B are formed. Next, by polishing a surface of the insulator 307A using the CMP, or the like, a surface of an insulator 307B is planarized while an upper surface of a variable resistive layer 104B is exposed. Next, as shown in FIG. 49, using the CVD method, a polysilicon 305A is deposited on the insulator 307A and the variable resistive layer 104B.

Next, dopants such as boron ions ($B^+$) are doped to the polysilicon 305A, and then, by conducting an activation anneal on the polysilicon 305A, the polysilicon 305A is changed into a p-type polysilicon 305A.

Figure 50:
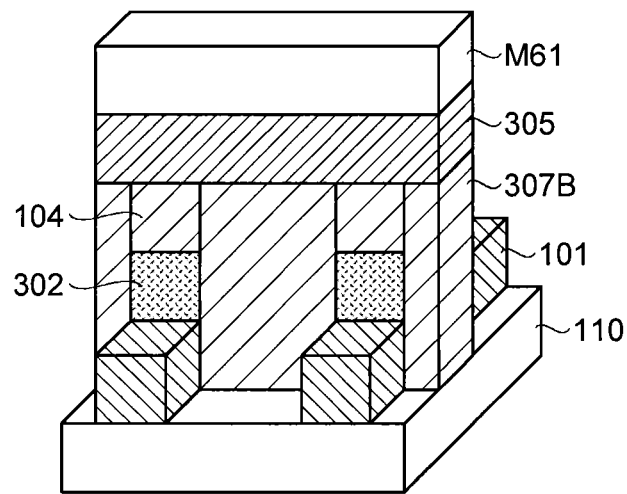
FIG. 50 is an illustration showing the production method of the non-volatile variable resistive element according to the third embodiment (phase 4)

Next, by depositing a mask layer (not shown) such a silicon oxide on the p-type polysilicon 305A and conducting a photolithography and etching process, the mask layer is processed into a mask pattern M61. Then, by dry-etching from the p-type polysilicon 305A to the lower wiring 302B using the mask pattern M51, the p-type polysilicon 305A is processed into the upper electrode wiring 305, the variable resistive layer 104B is processed into the variable resistive layer 104, and the lower wiring 302B is processed into the lower electrode 302 as shown in FIG. 50.

After that, by removing the remaining insulator 307B and the mask pattern M61 using wet-etching and depositing the insulator 107 between the cells using the CVD method, the non-volatile variable resistive element 300 according to the third embodiment is manufactured.

Fourth Embodiment

Next, a non-volatile variable resistive element, a controlling device, a storage device and a method of controlling the non-volatile variable resistive element according to a fourth embodiment will be explained below in detail with reference to the accompanying drawings. In the fourth embodiment, still another example of the non-volatile variable resistive element will be described. In the following, as for the same structures as the above-described embodiments, the same reference numbers will be applied and redundant explanations will be omitted.

Figure 51:
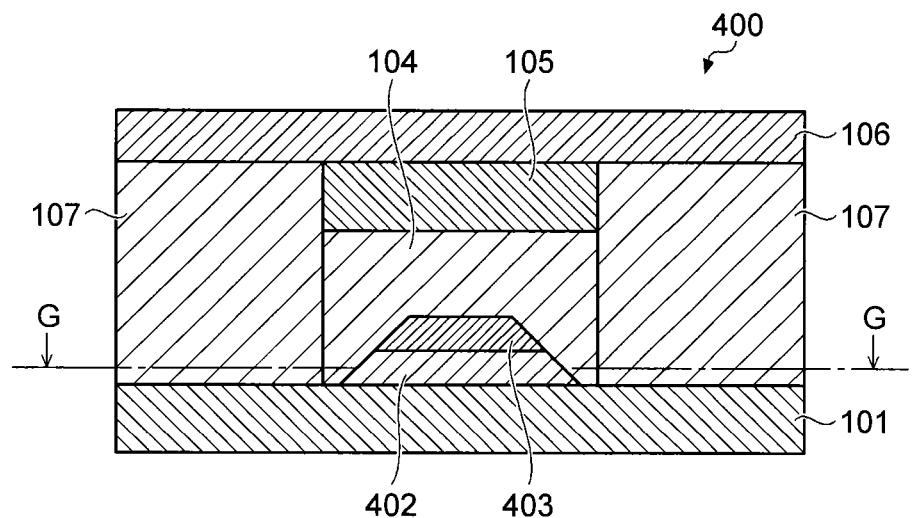
FIG. 51 is a vertical sectional view of a non-volatile variable resistive element according to a fourth embodiment when the non-volatile variable resistive element is cut in a direction of stack.
Figure 52:
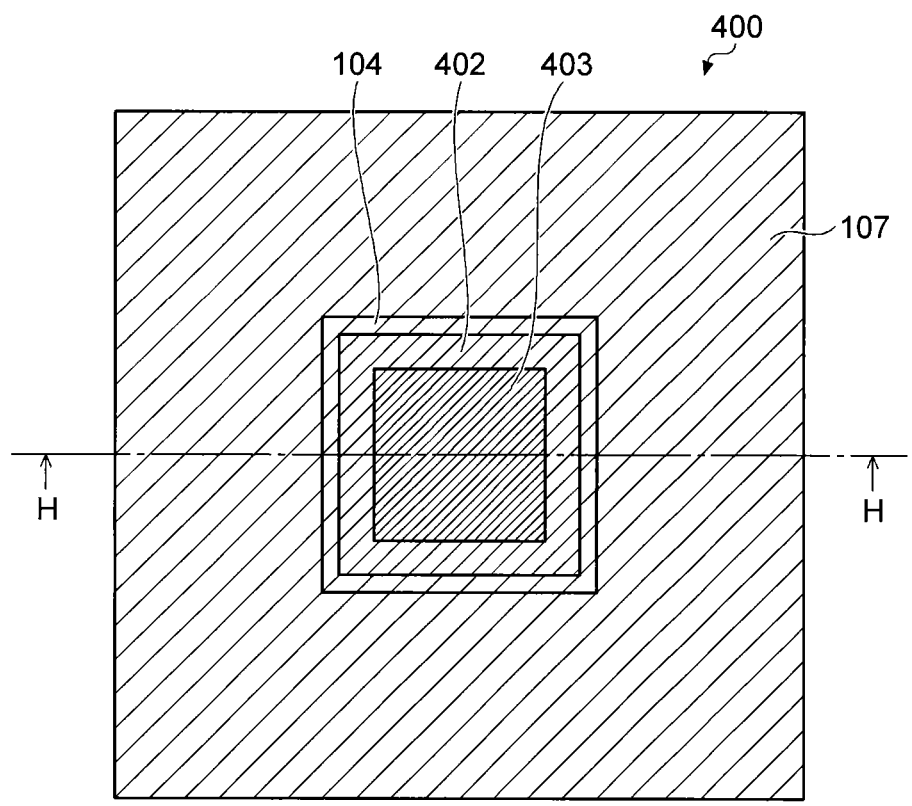
FIG. 52 is a horizontal sectional view of the non-volatile variable resistive element according to the fourth embodiment.

FIGS. 51 and 52 show an example of an outline structure of a non-volatile variable resistive element according to the fourth embodiment. FIG. 51 shows a vertical sectional view of the non-volatile variable resistive element 400 according to the fourth embodiment when the non-volatile variable resistive element 400 is cut in a direction of stack. FIG. 52 shows a horizontal sectional view of the non-volatile variable resistive element 400 according to the fourth embodiment. Here, FIG. 51 shows a H-H cross-section structure in FIG. 52, and FIG. 52 shows a G-G cross-section structure in FIG. 51.

As is clear from a comparison between FIGS. 51 and 52 and FIGS. 2 and 3, the non-volatile variable resistive element 400 according to the fourth embodiment has the same structure as the non-volatile variable resistive element 100 according to the first embodiment except that the first electrode 102 and the second electrode 103 are replaced with a first electrode 402 and a second electrode 403, respectively. The second electrode 403 is located at a center of a bottom of a hole surrounded by the insulator 107, for instance, and has a square prismoid shape. The first electrode 402 is located on an upper surface of the second electrode 403, for instance, and has a square prismoid shape. Here, the second electrode 403 contacts with the lower wiring 101. Furthermore, a bottom of the second electrode 403 is located inside an upper surface of the first electrode 402.

Also according to such structure as above, it is possible to obtain the same effects as the above-described embodiments. Because the other structures and operations are the same as the above-described embodiments, the detailed descriptions are omitted here.

Next, a method of manufacturing the non-volatile variable resistive element 400 according to the fourth embodiment will be described in detail with accompanying drawings.

Figure 53:
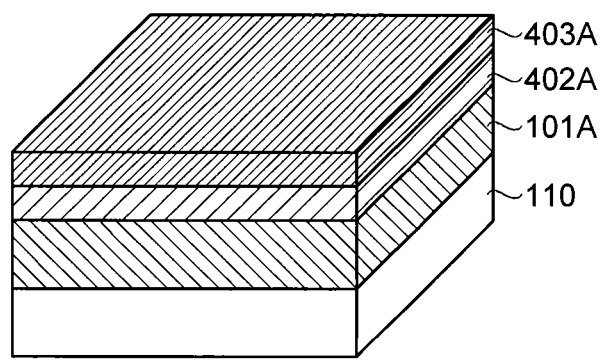
FIG. 53 is an illustration showing a production method of the non-volatile variable resistive element according to the fourth embodiment (phase 1)

Firstly, as shown in FIG. 53, using the CVD method, the lower wiring layer 101A, a first metal layer 402A used for the first electrode 402, and a second metal layer 403A used for the second electrode 403 are serially deposited on the monocrystalline silicon substrate 110.

Figure 54:
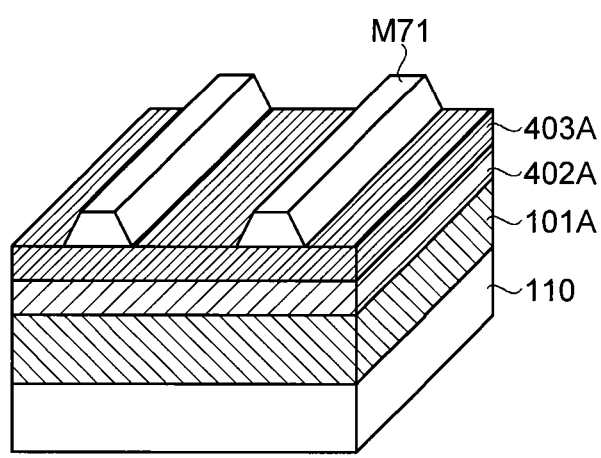
FIG. 54 is an illustration showing the production method of the non-volatile variable resistive element according to the fourth embodiment (phase 2)

Next, by depositing a mask layer such as a silicon oxide on the second metal layer 403A using the CVD method, and then conducting a photolithography and etching process on the mask layer, a mask pattern M71 having a skirt shape being extended in a tapered shape toward a base thereof is formed as shown in FIG. 54. Here, the mask pattern M71 having the skirt shape being extended in the tapered shape toward the base can be formed by optimizing the photolithography and etching process, for instance.

Figure 55:
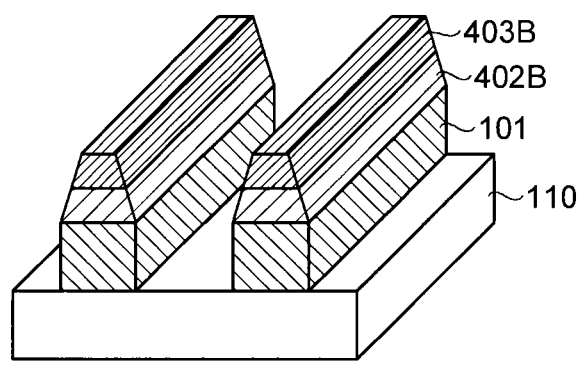
FIG. 55 is an illustration showing the production method of the non-volatile variable resistive element according to the fourth embodiment (phase 3)

Next, by dry-etching or wet-etching, the first metal layer 402A and the second metal layer 403A are processed. In this process, by etching at an angle but not at right angles with respect to the upper surface of the substrate, a second electrode 403B and a first electrode 402B each of which has a skirt shape being extended downwardly in a tapered shape are formed. Furthermore, by processing the lower wiring layer 101A by dry-etching using the mask pattern M71, the first electrode 402 and the second electrode 403 as masks, for instance, the lower wiring 101 is formed in a self-aligned manner. Then, by removing the mask pattern M71, a cross-sectional shape as shown in FIG. 55 can be obtained.

Figure 56:
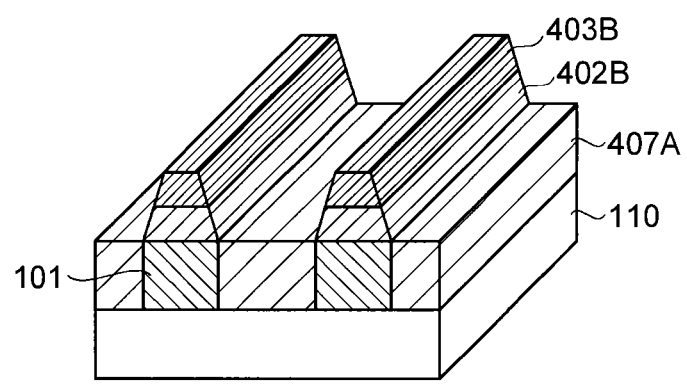
FIG. 56 is an illustration showing the production method of the non-volatile variable resistive element according to the fourth embodiment (phase 4)

Next, as shown in FIG. 56, by the CVD method, an insulator 407A is formed, for instance, and by dry-etching, a thickness of the formed insulator 407A is adjusted to a constant thickness, for instance.

Figure 57:
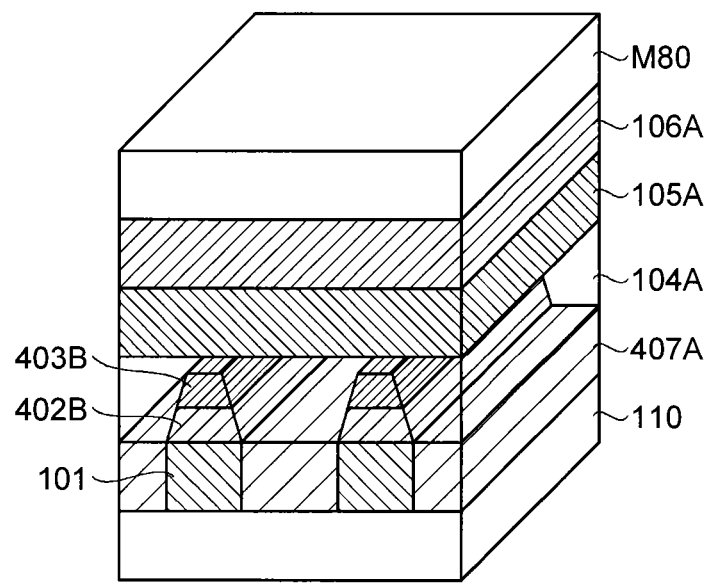
FIG. 57 is an illustration showing the production method of the non-volatile variable resistive element according to the fourth embodiment (phase 5)

Next, as shown in FIG. 57, an amorphous silicon layer 104A used for the variable resistive layer 104 is deposited using the CVD method, and an upper surface of the amorphous silicon layer 104A is planarized by the CMP, or the like, and then a polysilicon 105A used for the third electrode 105 is deposited on the amorphous silicon layer 104A. Next, dopants such as boron ions ($B^+$) are doped to the polysilicon 105A, and then, by conducting an activation anneal on the polysilicon 105A, the polysilicon 105A is changed into a p-type polysilicon 105A. Then, an upper wiring layer 106A used for the upper wiring 106 is deposited on the p-type polysilicon 105A. Furthermore, on the upper wiring layer 106A, a mask layer M80 such as a silicon oxide is deposited.

Figure 58:
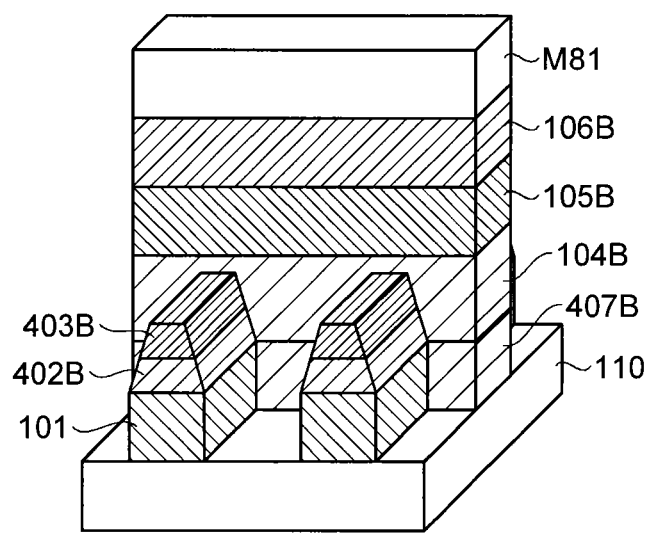
FIG. 58 is an illustration showing the production method of the non-volatile variable resistive element according to the fourth embodiment (phase 6)

Next, by conducting a photolithography and etching process, for example, the mask layer M80 is processed into a mask pattern M81, and then by dry-etching the layers from the upper wiring layer 106A to the insulator 407A using the mask pattern M81, the upper wiring layer 106A, the p-type polysilicon 105A and the variable resistive layer 104A are processed into the upper wiring 106, the third electrode 105 and the variable resistive layer 104 as shown in FIG. 58.

After that, by removing the remaining insulator 407B and the mask pattern M81 using wet-etching and depositing the insulator 107 between the cells using the CVD method, the non-volatile variable resistive element 400 according to the fourth embodiment is manufactured.

Fifth Embodiment

Next, a non-volatile variable resistive element, a controlling device, a storage device and a method of controlling the non-volatile variable resistive element according to a fifth embodiment will be explained below in detail with reference to the accompanying drawings. In the above-described embodiments, the cases where binary data (1 bit) is stored in a single non-volatile variable resistive element were described. However, the embodiments are not limited to such cases while it is also possible that multiple-valued data (4 bit, for instance) is stored in the above-described single non-volatile variable resistive element. Although the following description will be explained while the non-volatile variable resistive element 100 according to the first embodiment is used as a base, the structure is not limited to such case while it is also possible to use the other non-volatile variable resistive elements 200 to 400 according to the second to fifth embodiments.

Figure 59:
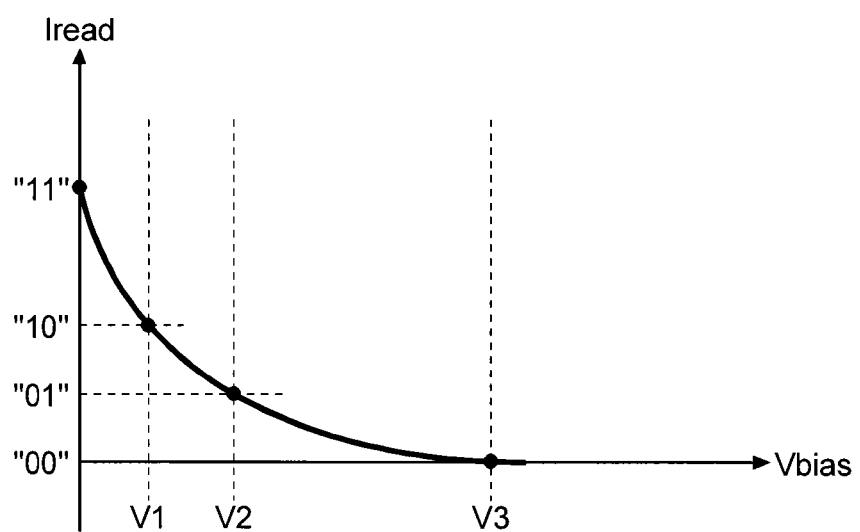
FIG. 59 is an illustration for explaining a reversed reset bias voltage for writing in quaternary in a single non-volatile variable resistive element in a fifth embodiment.
Figure 60:
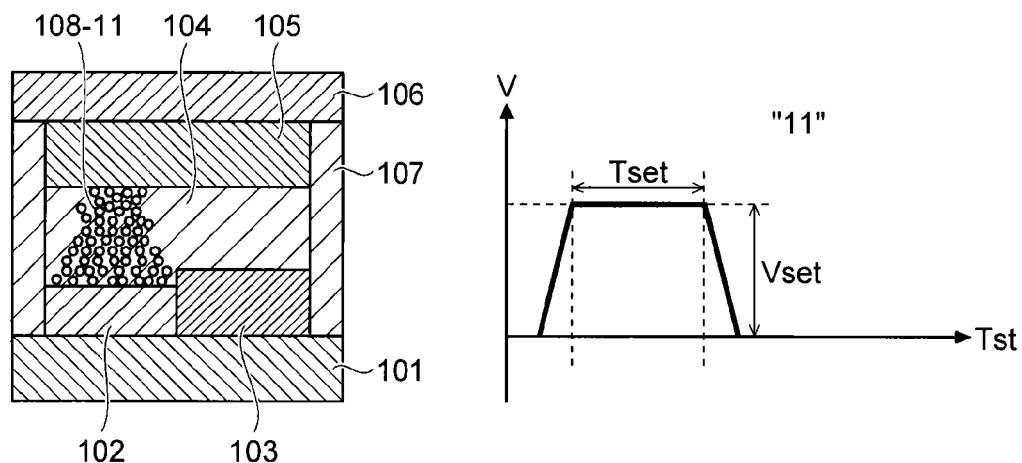
FIG. 60 is an illustration for explaining a case where a value '11' is written in the non-volatile variable resistive element based on the reversed reset bias voltage shown an FIG. 59.
Figure 61:
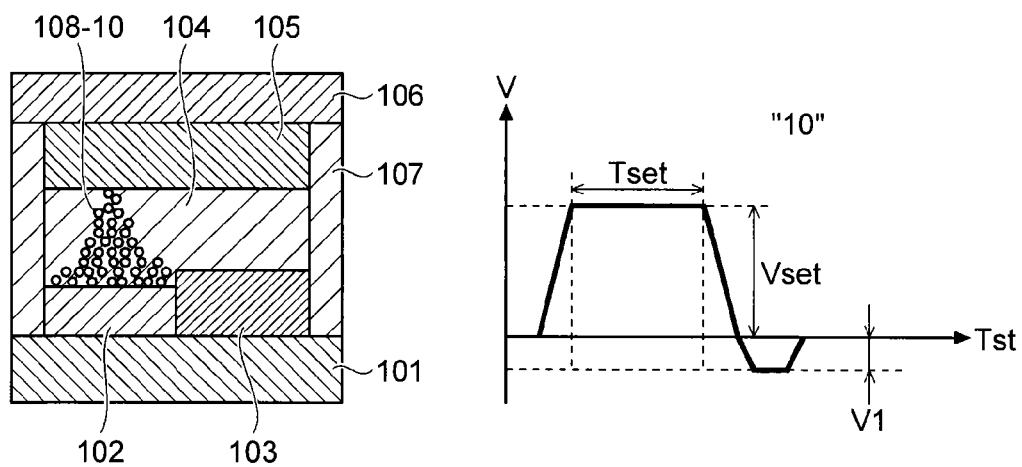
FIG. 61 is an illustration for explaining a case where a value '10' is written in the non-volatile variable resistive element based on the reversed reset bias voltage shown in FIG. 59.

FIG. 59 is an illustration for explaining a reversed reset bias voltage for writing in quaternary in a single non-volatile variable resistive element in the fifth embodiment. FIGS. 60 to 63 are timing charts of voltage pulses for writing quaternary in a single non-volatile variable resistive element based on the reversed reset bias voltage shown in FIG. 59 and illustrations for explaining conductive filaments formed in the variable resistive layer in these cases. FIG. 60 is an illustration for explaining a case where a value '11' is written, FIG. 61 is an illustration for explaining a case where a value '10' is written, FIG. 62 is an illustration for explaining a case where a value '01' is written, and FIG. 63 is an illustration for explaining a case where a value '00' is written.

As shown in FIGS. 59 and 60, when quaternary is written by the mode P with a stress voltage Vset and a stress time Tset, for instance, a conductive filament 108-11 is formed in the variable resistive layer 104, and as a result, the non-volatile variable resistive element 100 stores a value '11'. The mode P may be either one of the modes P1 and P2. Here, a case where the mode P is the mode P1 is explained as an example.

As shown in FIGS. 59 and 61, after wiring by the mode P, by applying the reversed reset bias voltage Vbias of which voltage value is V1 during a certain stress time, a conductive filament 108-10 formed in the variable resistive layer 104 becomes smaller than the conductive filament 108-11, and thereby it is possible to change the value stored in the non-volatile variable resistive element 100 from '11' to '10'. Here, the reversed reset bias voltage Vbias is a voltage of which polarity is opposite to the polarity of the stress voltage Vset in the mode P. Likewise, after writing by the mode P, by applying the reversed reset bias voltage Vbias of which voltage value is V2 being smaller than V1 or V3 being smaller than V2 during a certain stress time (reversed reset bias time Tbias), a scale of the conductive filament 108-01 or 108-00 is controlled, and thereby it is possible to change the value stored in the non-volatile variable resistive element 100 from '11' to '01' or '00'. Here, an absolute value of the voltage value V3 may be different from or the same as an absolute value of the stress voltage Vset.

In this way, after writing to the non-volatile variable resistive element 100 by the mode P, by applying the reversed reset bias voltage Vbias of which polarity is opposite to the polarity of the stress voltage Vset for data writing, the state of the conductive filament 108 (or 118) formed in the variable resistive layer 104 is gradated, and thereby it is possible to change a resistance of the variable resistive layer 104 in multiple values. Thereby, the readout current Iread at a time of data readout is multivalued, whereby it is possible to let the non-volatile variable resistive element 100 operate as a multivalued memory cell.

In FIGS. 59 to 63, although the case where the voltage value of the reversed reset bias voltage Vbias is changed based on a value to be stored in the non-volatile variable resistive element 100 has been shown, the embodiment is not limited to such case. For example, it is also acceptable that the voltage value of the reversed reset bias voltage Vbias is set to a constant value and the stress time (reversed reset bias time Tbias) for applying the reversed reset bias voltage Vbias is changed based on a value to be stored in the non-volatile variable resistive element 100.

Figure 64:
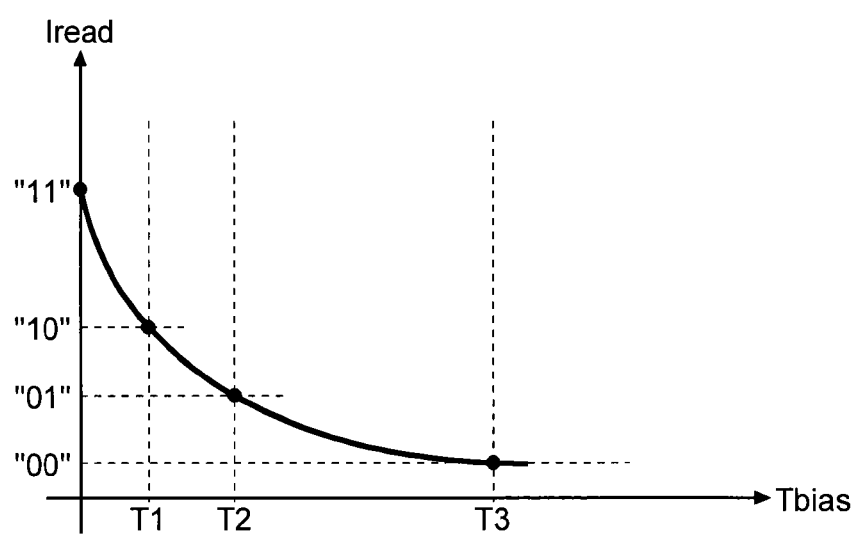
FIG. 64 is an illustration for explaining a reversed reset bias time for writing in quaternary in a single non-volatile variable resistive element in the fifth embodiment.
Figure 65:
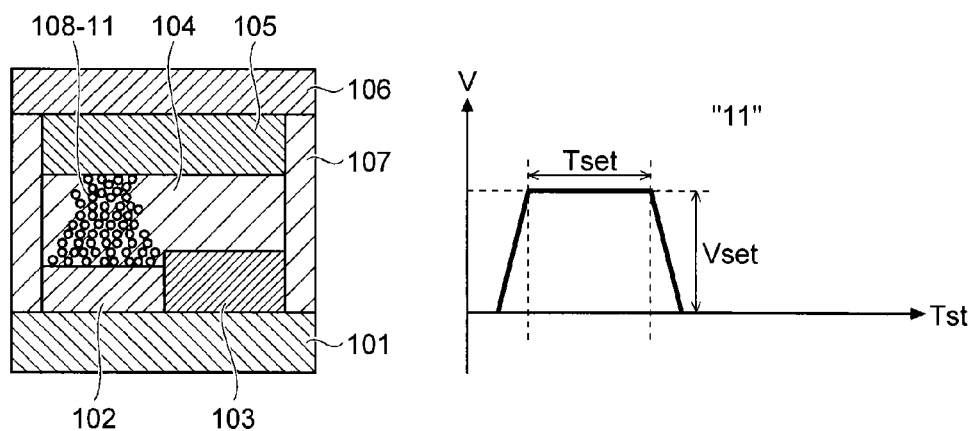
FIG. 65 is an illustration for explaining a case where a value '11' is written in the non-volatile variable resistive element based on the reversed reset bias voltage shown in FIG. 64.
Figure 66:
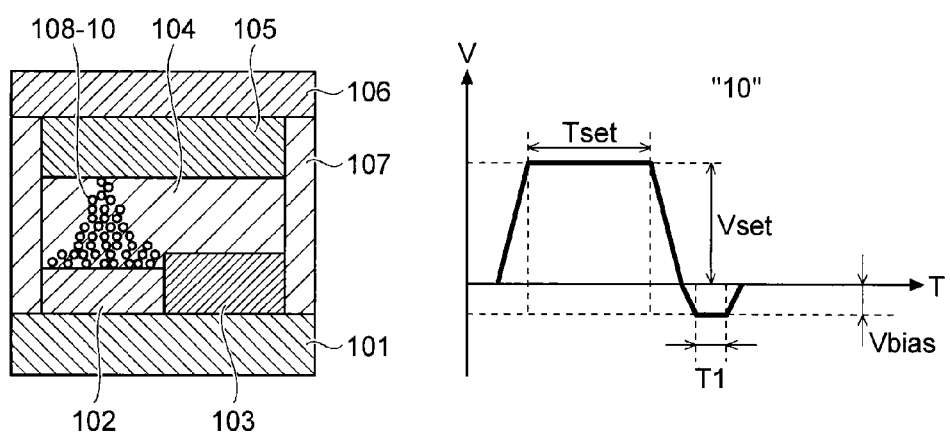
FIG. 66 is an illustration for explaining a case where a value '10' is written in the non-volatile variable resistive element based on the reversed reset bias voltage shown in FIG. 64.
Figure 67:
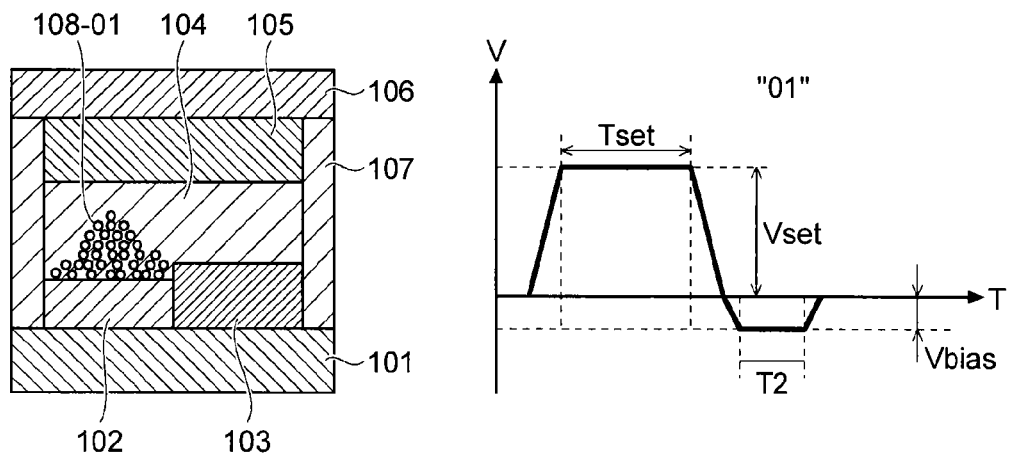
FIG. 67 is an illustration for explaining a case where a value '01' is written in the non-volatile variable resistive element based on the reversed reset bias voltage shown in FIG. 64.
Figure 68:
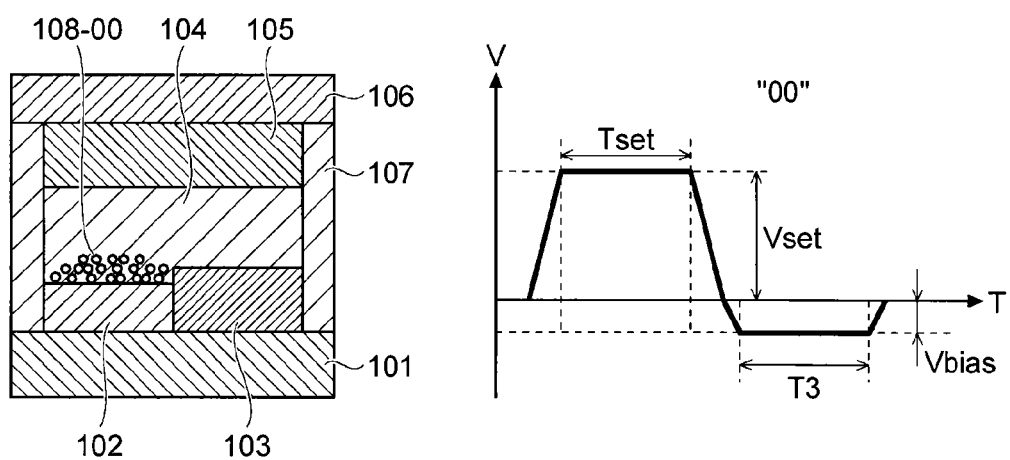
FIG. 68 is an illustration for explaining a case where a value '00' is written in the non-volatile variable resistive element based on the reversed reset bias voltage shown in FIG. 54.

FIG. 64 is an illustration for explaining a reversed reset bias time for writing in quaternary in a single non-volatile variable resistive element in the fifth embodiment. FIGS. 65 to 68 are timing charts of voltage pulses for writing quaternary in a single non-volatile variable resistive element based on the reversed reset bias time shown in FIG. 64 and illustrations for explaining conductive filaments formed in the variable resistive layer in these cases. FIG. 65 is an illustration for explaining a case where a value '11' is written, FIG. 66 is an illustration for explaining a case where a value '10' is written, FIG. 67 is an illustration for explaining a case where a value '01' is written, and FIG. 68 is an illustration for explaining a case where a value '00' is written.

As shown in FIGS. 64 and 65, when quaternary is written by the mode P with a stress voltage Vset and a stress time Tset, for instance, a conductive filament 108-11 is formed in the variable resistive layer 104, and as a result, the non-volatile variable resistive element 100 stores a value '11'. The mode P may be either one of the modes P1 and P2. Here, a case where the mode P is the mode P1 is explained as an example.

As shown in FIGS. 64 and 66, after writing by the mode P, by applying the reversed reset bias voltage Vbias of which voltage value is constant during a reversed reset bias time of which time length is T1, a conductive filament 108-10 formed in the variable resistive layer 104 becomes smaller than the conductive filament 108-11, and thereby it is possible to change the value stored in the non-volatile variable resistive element 100 from '11' to '10'. Here, the reversed reset bias voltage Vbias is a voltage of which polarity is opposite to the polarity of the stress voltage Vset in the mode P. Likewise, after writing by the mode P, by applying the constant reversed reset bias voltage Vbias during a stress time Tbias of which time length is T2 being longer than T1 or T3 being longer than T2, a scale of the conductive filament 108-01 or 108-00 is controlled, and thereby it is possible to change the value stored in the non-volatile variable resistive element 100 from '11' to '01' or '00'. Here, the time length T3 may be different from or the same as the time length of the stress time Tset.

In this way, after writing to the non-volatile variable resistive element 100 by the mode P, by applying the reversed reset bias voltage Vbias of which polarity is opposite to the polarity of the stress voltage Vset for data writing for a period of time depending on a value to be stored, the state of the conductive filament 108 (or 118) formed in the variable resistive layer 104 is gradated, and thereby it is possible to change a resistance of the variable resistive layer 104 in multiple values. Thereby, the readout current Iread at a time of data readout is multivalued, whereby it is possible to let the non-volatile variable resistive element 100 operate as a multivalued memory cell.

Figure 69:
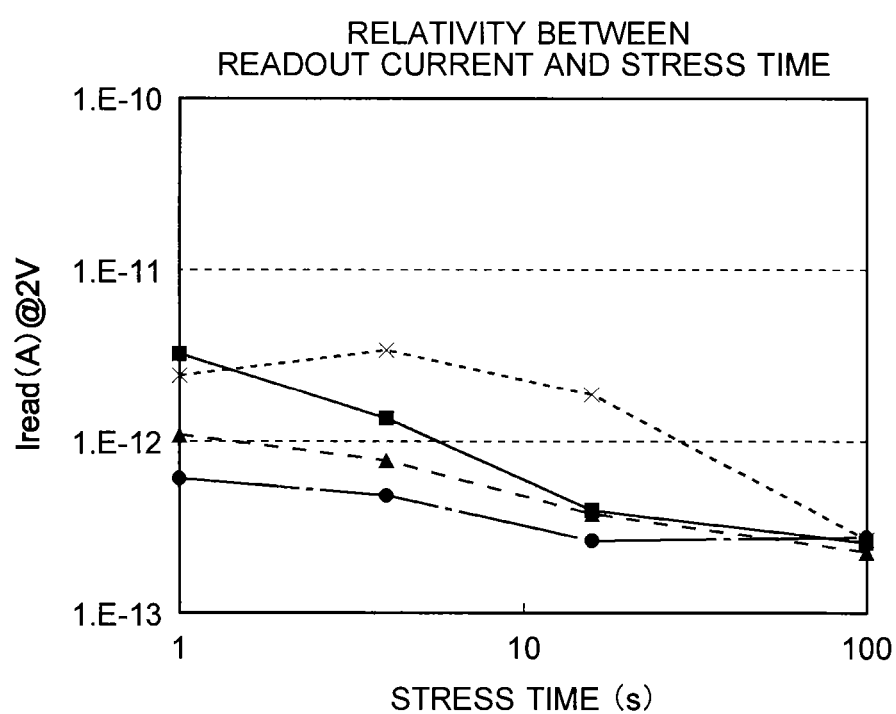
FIG. 69 is an illustration showing an evaluation result indicating a characteristic of a readout current with respect to a combination of the reversed reset bias voltage and the reversed reset bias time according to the fifth embodiment.

FIG. 69 shows an evaluation result indicating a characteristic of a readout current with respect to a combination of the reversed reset bias voltage and the reversed reset bias time. As shown in FIG. 69, when the reversed reset bias voltage Vbias is set to constant, the longer reversed the reset stress time Tbias is, the smaller the readout current Iread becomes. When the reversed reset bias time Tbias is set to constant, the larger the absolute value of the reversed reset stress voltage Vbias is, the smaller the readout current Iread becomes. As described above, by multivaluing the readout current Iread at a time of data readout, it is possible to let the non-volatile variable resistive element 100 operate as a multivalued memory cell.

Because the other structures and operations are the same as the above-described embodiments, the detailed descriptions are omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile resistive element comprising:
 a variable resistive laver;
 a first electrode including a first metal and placed at a first side of the variable resistive layer;
 a second electrode including a second metal and placed at the first side of the variable resistive layer; and
 a third electrode placed at a second side of the variable resistive layer;
 the second side being opposed to the first side of the variable resistive laver, and the variable resistive layer being sandwiched between the first and second electrodes and the third electrode;
 wherein a resistance of the variable resistive layer reduces when at least either one of the metal and the second metal is diffused into the variable resistive layer, and the resistance of the variable resistive layer increases when at least either one of the first metal and the second metal diffused into the variable resistive layer is collected by the first electrode or the second electrode.

2. The element according to claim 1, wherein
 a thickness of a part of the variable resistive layer lying between the first electrode and the third electrode differs from a thickness of the other part of the variable resistive layer lying between the second electrode and the third electrode.

3. The element according to claim 1, wherein
 a thickness of a part of the variable resistive layer lying between the second electrode and the third electrode is thinner than a thickness of the other part of the variable resistive layer lying between the first electrode and the third electrode.

4. The element according to claim 1, wherein
 a distance between the first electrode and the third electrode is greater than a distance between the second electrode and the third electrode.

5. The element according to claim 1, wherein
 at least one between a data retention characteristic and a number of cyclings of a conductive filament formed in the variable resistive layer by the second metal differs from a data retention characteristic or a number of cyclings of a conductive filament formed in the variable resistive layer by the first metal.

6. The element according to claim 5, wherein
a thickness of a part of the variable resistive layer lying between the second electrode and the third electrode is thinner than a thickness of the other part of the variable resistive layer lying between the first electrode and the third electrode.

7. The element according to claim 1, wherein
a minimum voltage value for diffusing the first metal into the variable resistive layer is smaller than a minimum voltage value for diffusing the second metal into the variable resistive layer.

8. The element according to claim 1, wherein
a period of time for the second metal to diffuse into the variable resistive layer when a first voltage is impressed is longer than a period of time for the first metal to diffuse into the variable resistive layer when the first voltage is impressed, and
a period of time for the second metal to diffuse into the variable resistive layer when a second voltage of which voltage value is larger than a voltage value of the first voltage is impressed is shorter than a period of time for the first metal to diffuse into the variable resistive layer when the second voltage is impressed.

9. The element according to claim 1, further comprising:
a first wiring contacting with the first and second electrodes; and
a second wiring contacting with the third electrode, wherein
the first wiring and the second wiring sandwich the first to third electrodes and the variable resistive layer therebetween, and
the first electrode is located on a side face of the second electrode so that the second electrode is surrounded by the first electrode.

10. The element according to claim 1, further comprising:
a first wiring on which the first electrode is located directly; and
a second wiring lying above the first wiring and under which the third electrode is located directly, wherein
the first wiring and the second wiring sandwich the first to third electrode and the variable resistive layer therebetween, and
the second electrode is located directly on the first electrode.

11. The element according to claim 10, wherein
a stack structure constructed by the first electrode and the second electrode has a tapered shape in which a face of the first electrode contacting with the first wiring is greater than a face of the second electrode facing the third electrode.

* * * * *